United States Patent
Roohparvar et al.

(10) Patent No.: US 7,409,493 B2
(45) Date of Patent: Aug. 5, 2008

(54) TOP/BOTTOM SYMMETRICAL PROTECTION SCHEME FOR FLASH

(75) Inventors: Frankie F. Roohparvar, Miltitas, CA (US); Kevin C. Widmer, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/541,820

(22) Filed: Oct. 2, 2006

(65) Prior Publication Data

US 2007/0028036 A1 Feb. 1, 2007

Related U.S. Application Data

(63) Continuation of application No. 10/670,038, filed on Sep. 24, 2003, now Pat. No. 7,177,976, which is a continuation of application No. 09/608,256, filed on Jun. 30, 2000, now Pat. No. 6,654,847.

(51) Int. Cl.
G06F 12/14 (2006.01)
(52) U.S. Cl. ....................... 711/103; 711/163
(58) Field of Classification Search ................ 711/100, 711/103, 154, 163; 365/185.04, 185.11
See application file for complete search history.

(56) References Cited

U.S. PATENT DOCUMENTS

| | | |
|---|---|---|
| 4,745,579 A | 5/1988 | Mead et al. |
| 4,905,063 A | 2/1990 | Beltram et al. |
| 5,041,886 A | 8/1991 | Lee |
| 5,140,182 A | 8/1992 | Ichimura |
| 5,173,876 A | 12/1992 | Kawashima et al. |
| 5,249,158 A | 9/1993 | Kynett et al. |
| 5,343,437 A | 8/1994 | Johnson et al. |
| 5,430,663 A | 7/1995 | Judd et al. |
| 5,432,927 A | 7/1995 | Grote et al. |
| 5,473,761 A * | 12/1995 | Parks et al. ............... 711/4 |
| 5,526,364 A | 6/1996 | Roohparvar |
| 5,537,354 A | 7/1996 | Mochizuki et al. |
| 5,539,894 A | 7/1996 | Webber |

(Continued)

FOREIGN PATENT DOCUMENTS

EP 0 806 772 A2 11/1997

OTHER PUBLICATIONS

Microsoft Press Computer Dictionary, Second Edition 1994 Definition of Shadow Memory p. 357.*

(Continued)

*Primary Examiner*—Paul R Myers
(74) *Attorney, Agent, or Firm*—Leffert Jay & Polglaze, P.A.

(57) ABSTRACT

A synchronous flash memory includes an array of non-volatile memory cells. The memory device has a package configuration that is compatible with an SDRAM. The memory device can comprise an array of memory cells having N addressable sectors, and control circuitry to control erase or write operations on the array of memory cells. Protection circuitry can be coupled to the control circuitry to selectively prevent erase or write operations from being performed on both first and last sectors of the N addressable sectors. The protection circuitry can comprise a multi-bit register having a first bit corresponding to the first sector and a second bit corresponding to the last sector.

20 Claims, 23 Drawing Sheets

U.S. PATENT DOCUMENTS

| | | | |
|---|---|---|---|
| 5,546,561 A | | 8/1996 | Kynett et al. |
| 5,566,323 A | | 10/1996 | Ugon |
| 5,568,641 A | * | 10/1996 | Nelson et al. .................. 713/2 |
| 5,598,548 A | | 1/1997 | Matsuo et al. |
| 5,600,605 A | | 2/1997 | Schaefer |
| 5,615,159 A | | 3/1997 | Roohparvar |
| 5,627,784 A | | 5/1997 | Roohparvar |
| 5,666,321 A | | 9/1997 | Schaefer |
| 5,673,222 A | | 9/1997 | Fukumoto et al. |
| 5,701,492 A | | 12/1997 | Wadsworth et al. |
| 5,727,005 A | | 3/1998 | Le et al. |
| 5,751,039 A | | 5/1998 | Kauffman et al. |
| 5,787,457 A | | 7/1998 | Miller et al. |
| 5,802,583 A | | 9/1998 | Yeager et al. |
| 5,845,332 A | * | 12/1998 | Inoue et al. .................. 711/163 |
| 5,860,135 A | | 1/1999 | Sugita |
| 5,889,987 A | | 3/1999 | Nelson et al. |
| 5,893,168 A | * | 4/1999 | Qureshi et al. ............. 711/166 |
| 5,936,903 A | | 8/1999 | Jeng et al. |
| 5,943,263 A | | 8/1999 | Roohparvar |
| 5,954,818 A | | 9/1999 | Dalvi et al. |
| 5,978,273 A | | 11/1999 | Shigemura |
| 5,982,661 A | | 11/1999 | Kawamata |
| 5,991,197 A | | 11/1999 | Ogura et al. |
| 5,995,438 A | | 11/1999 | Jeng et al. |
| 6,000,004 A | * | 12/1999 | Fukumoto ................... 711/103 |
| 6,026,016 A | | 2/2000 | Gafken |
| 6,026,465 A | | 2/2000 | Mills et al. |
| 6,028,798 A | | 2/2000 | Roohparvar |
| 6,031,757 A | | 2/2000 | Chuang et al. |
| 6,034,889 A | | 3/2000 | Mani et al. |
| 6,137,133 A | | 10/2000 | Kauffman et al. |
| 6,141,247 A | | 10/2000 | Roohparvar et al. |
| 6,154,819 A | | 11/2000 | Larsen et al. |
| 6,192,456 B1 | | 2/2001 | Lin et al. |
| 6,205,548 B1 | * | 3/2001 | Hasbun ........................ 713/2 |
| 6,240,519 B1 | | 5/2001 | James, Jr. et al. |
| 6,266,282 B1 | * | 7/2001 | Hwang et al. .......... 365/185.33 |
| 6,308,265 B1 | | 10/2001 | Miller |
| 6,331,950 B1 | | 12/2001 | Kuo et al. |
| 6,401,164 B1 | | 6/2002 | Bartoli et al. |
| 6,490,202 B2 | | 12/2002 | Roohparvar |
| 6,654,847 B1 | * | 11/2003 | Roohparvar et al. ........ 711/103 |
| 6,678,788 B1 | * | 1/2004 | O'Connell ................... 711/114 |
| 6,725,321 B1 | * | 4/2004 | Sinclair et al. .............. 711/103 |
| 7,177,976 B2 | * | 2/2007 | Roohparvar et al. ........ 711/103 |

OTHER PUBLICATIONS

Keeth, et al., "DRAM circuit design: a tutorial," IEEE Press, 2001, pp. 16-23, 142-153.

Micron Semiconductor Products, Inc., "2Mb, Smart 5 BIOS-Optimized Boot Block Flash Memory," *Flash Memory* www.micron.com, copyright 2000, Micron Technology, Inc., pp. 1-12.

Micron, "16 Mb: x16 SDRAM" *Synchronous DRAM*, www.micron.com, copyright 1999 Micron Technology, Inc., pp. 1-51.

\* cited by examiner

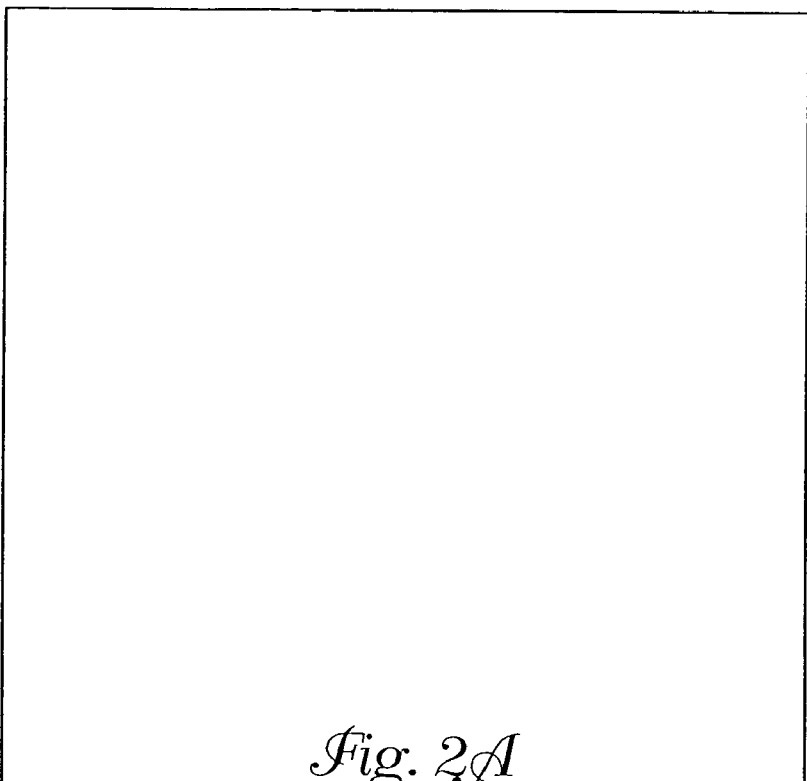
Fig. 2A
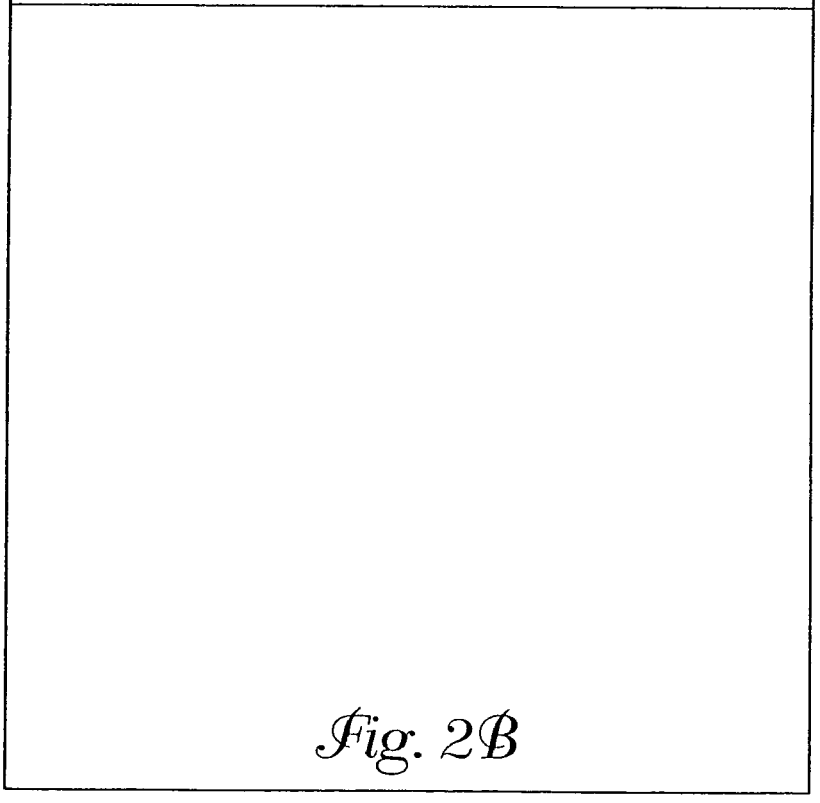
Fig. 2B
Fig. 2

ADDRESS RANGE

| Bank | Row | Column | Block |
|---|---|---|---|
| 3 | FFF | FFH | 256K-Word Block 15 — 210 |
| 3 | C00 | 00H | |
| 3 | BFF | FFH | 256K-Word Block 14 |
| 3 | 800 | 00H | |
| 3 | 7FF | FFH | 256K-Word Block 13 |
| 3 | 400 | 00H | |
| 3 | 3FF | FFH | 256K-Word Block 12 |
| 3 | 000 | 00H | |
| 2 | FFF | FFH | 256K-Word Block 11 |
| 2 | C00 | 00H | |
| 2 | BFF | FFH | 256K-Word Block 10 |
| 2 | 800 | 00H | |
| 2 | 7FF | FFH | 256K-Word Block 9 |
| 2 | 400 | 00H | |
| 2 | 3FF | FFH | 256K-Word Block 8 |
| 2 | 000 | 00H | |
| 1 | FFF | FFH | 256K-Word Block 7 |
| 1 | C00 | 00H | |
| 1 | BFF | FFH | 256K-Word Block 6 |
| 1 | 800 | 00H | |
| 1 | 7FF | FFH | 256K-Word Block 5 |
| 1 | 400 | 00H | |
| 1 | 3FF | FFH | 256K-Word Block 4 |
| 1 | 000 | 00H | |
| 0 | FFF | FFH | 256K-Word Block 3 |
| 0 | C00 | 00H | |
| 0 | BFF | FFH | 256K-Word Block 2 |
| 0 | 800 | 00H | |
| 0 | 7FF | FFH | 256K-Word Block 1 |
| 0 | 400 | 00H | |
| 0 | 3FF | FFH | 256K-Word Block 0 — 220 |
| 0 | 000 | 00H | |

Bank 3 / Bank 2 / Bank 1 / Bank 0

Word-wide (x16)

 Software Lock = Hardware-Lock Sectors
RP# = V$_{HH}$ to unprotect if either the
block protect or device protect bit is set.

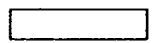 Software Lock = Hardware-Lock Sectors
RP# = V$_{CC}$ to unprotect but must be V$_{HH}$
if the device protect bit is set.

See BLOCK PROTECT/UNPROTECT SEQUENCE for detailed information.

*Fig. 19*

TOP/BOTTOM SYMMETRICAL PROTECTION SCHEME FOR FLASH

TECHNICAL FIELD OF THE INVENTION

This is a continuation application of U.S. patent application Ser. No. 10/670,038, filed Sep. 24, 2003, now U.S. Pat. No. 7,177,976, which is a continuation application of U.S. patent application Ser. No. 09/608,256, filed Jun. 30, 2000, now U.S. Pat. No. 6,654,847, issued Nov. 25, 2003, which application is assigned to the assignee of the present invention and the entire contents of which are incorporated herein by reference. The present invention relates generally to non-volatile memory devices and in particular the present invention relates to a synchronous non-volatile flash memory.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCS have their BIOS stored on a flash memory chip so that it can easily be updated if necessary. Such a BIOS is sometimes called a flash BIOS. Flash memory is also popular in modems because it enables the modern manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

For the reasons stated above, and for other reasons stated below which will become apparent to those skilled in the art upon reading and understanding the present specification, there is a need in the art for a non-volatile memory device that can operate in a manner similar to SDRAM operation.

BRIEF DESCRIPTION OF THE DRAWINGS

FIG. 19 illustrates a memory array block arrangement of an embodiment of the present invention.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The following detailed description is divided into two major sections. The first section is an Interface Functional Description that details compatibility with an SDRAM memory. The second major section is a Functional Description that specifies flash architecture functional commands.

Interface Functional Description

Figure 1A:
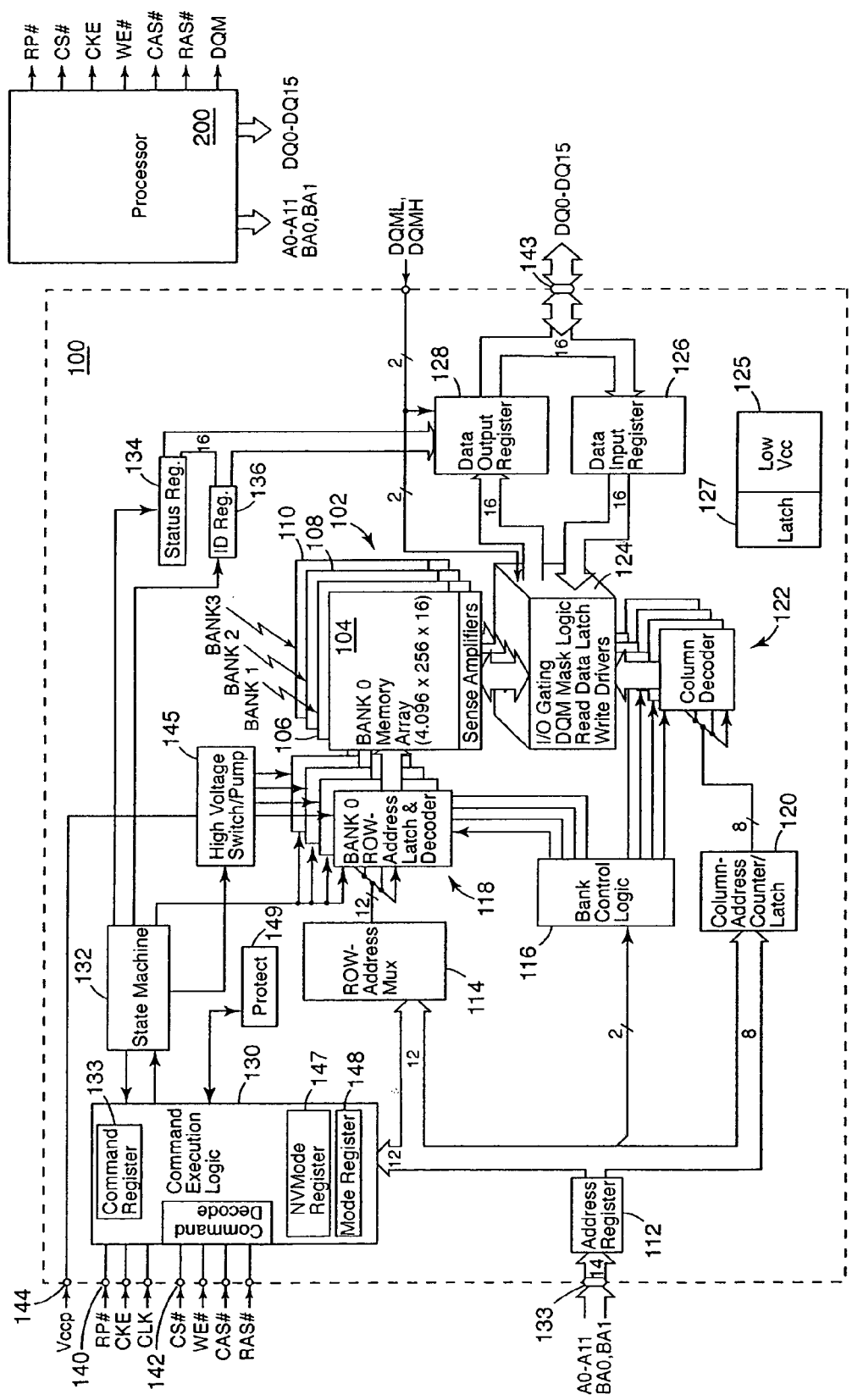
FIG. 1A is a block diagram of a synchronous flash memory of the present invention.

Referring to FIG. 1A, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations.

Figure 1B:
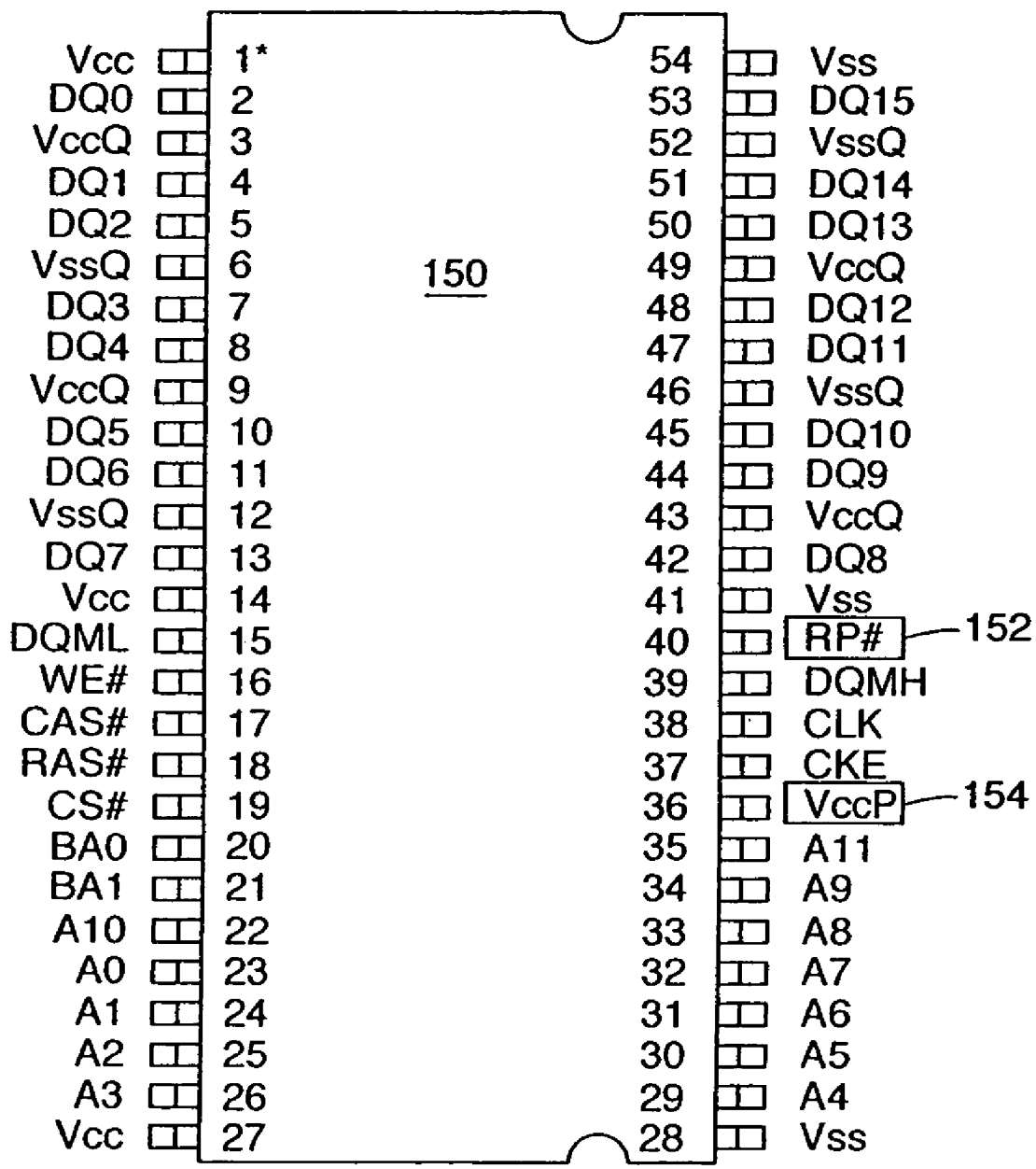
FIG. 1B is an integrated circuit pin interconnect diagram of one embodiment of the present invention.
Figure 1C:
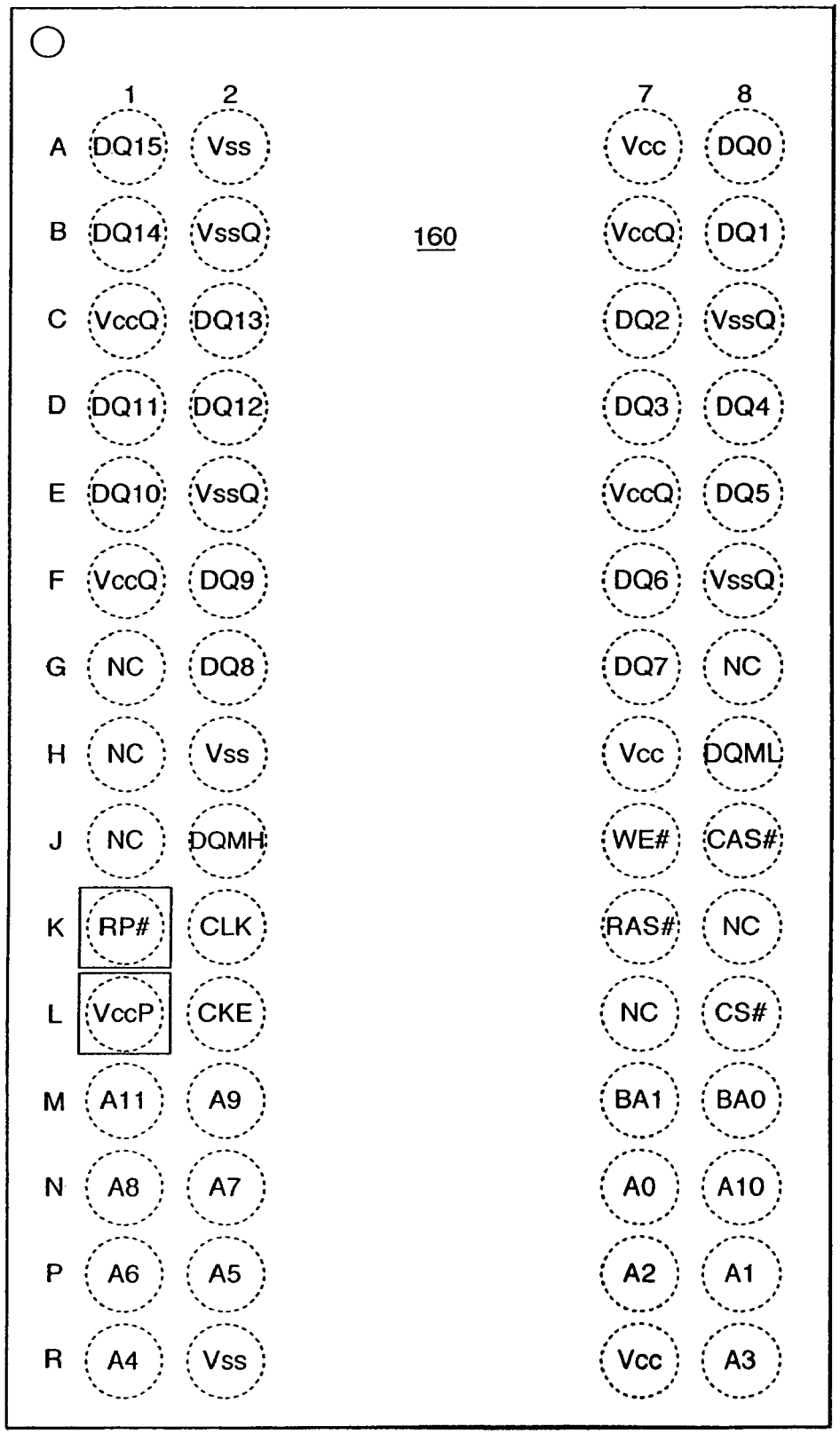
FIG. 1C is an integrated circuit interconnect bump grid array diagram of one embodiment of the present invention.

FIG. 1B illustrates an interconnect pin assignment of one embodiment of the present invention. The memory package 150 has 54 interconnect pins. The pin configuration is substantially similar to available SDRAM packages. Two interconnects specific to the present invention are RP# 152 and Vccp 154. Although the present invention may share interconnect labels that are appear the same as SDRAM's, the function of the signals provided on the interconnects are described herein and should not be equated to SDRAM's unless set forth herein. FIG. 1C illustrates one embodiment of a memory package 160 that has bump connections instead of the pin connections of FIG. 1C. The present invention, therefore, is not limited to a specific package configuration.

Prior to describing the operational features of the memory device, a more detailed description of the interconnect pins and their respective signals is provided.

The input clock connection is used to provide a clock signal (CLK). The clock signal can be driven by a system clock, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0-DQ7 and DQMH corresponds to data connections DQ8-DQ15. DQML and DQMH are considered to be the same state when referenced as DQM.

Address inputs 133 are primarily used to provide address signals. In the illustrated embodiment the memory has 12 lines (A0-A11). Other signals can be provided on the address connections, as described below. The address inputs are sampled during an ACTIVE command (row-address A0-A11) and a READ/WRITE command (column-address A0-A7) to select one location in a respective memory bank. The address inputs are also used to provide an operating code (OpCode) during a LOAD COMMAND REGISTER operation, explained below. Address lines A0-A11 are also used to input mode settings during a LOAD MODE REGISTER operation.

An input reset/power-down (RP#) connection 140 is used for reset and power-down operations. Upon initial device power-up, a 100 μs delay after RP# has transitioned from LOW to HIGH is required in one embodiment for internal device initialization, prior to issuing an executable command. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register 149, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0-DQ15 connections 143 are data bus connections used for bi-directional data communication. Referring to FIG. 1B, a VCCQ connection is used to provide isolated power to the DQ connections to improved noise immunity. In one embodiment, VCCQ=Vcc or 1.8V+0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

The following sections provide a more detailed description of the operation of the synchronous flash memory. One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation.

The synchronous flash memory can operate in low-power memory systems, such as systems operating on three volts. A deep power-down mode is provided, along with a power-saving standby mode. All inputs and outputs are low voltage transistor-transistor logic (LVTTL) compatible. The synchronous flash memory offers substantial advances in Flash operating performance, including the ability to synchronously burst data at a high data rate with automatic column address generation and the capability to randomly change column addresses on each clock cycle during a burst access.

In general, the synchronous flash memory is configured similar to a multi-bank DRAM that operates at low voltage and includes a synchronous interface. Each of the banks is organized into rows and columns. Prior to normal operation, the synchronous flash memory is initialized. The following sections provide detailed information covering device initialization; register definition, command descriptions and device operation.

The synchronous flash is powered up and initialized in a predefined manner. After power is applied to VCC, VCCQ and VCCP (simultaneously), and the clock signal is stable, RP# 140 is brought from a LOW state to a HIGH state. A delay, such as a 100 μs delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The device will power up in a programmed state and will not require reloading of the non-volatile mode register 147 prior to issuing operational commands. This is explained in greater detail below.

Figure 2A:
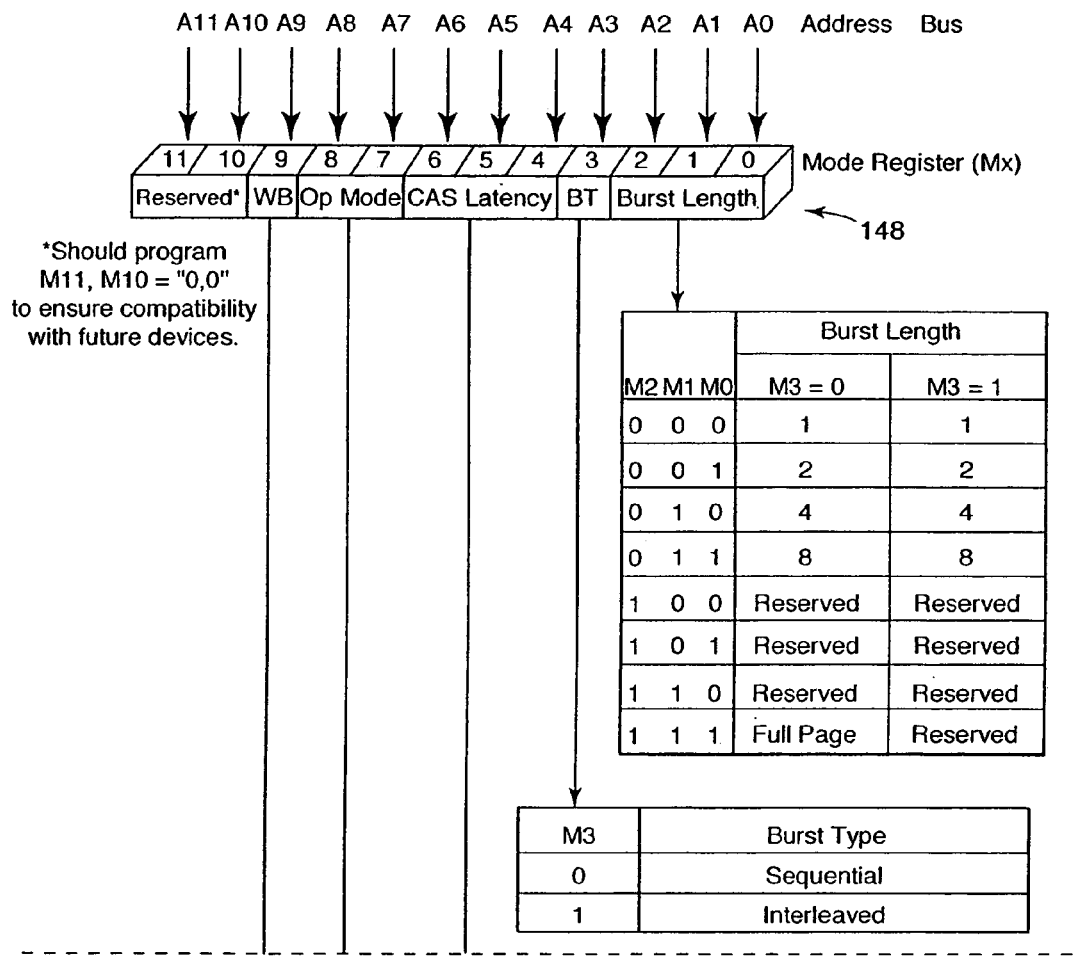
FIG. 2 illustrates a mode register of one embodiment of the present invention.
Figure 2B:
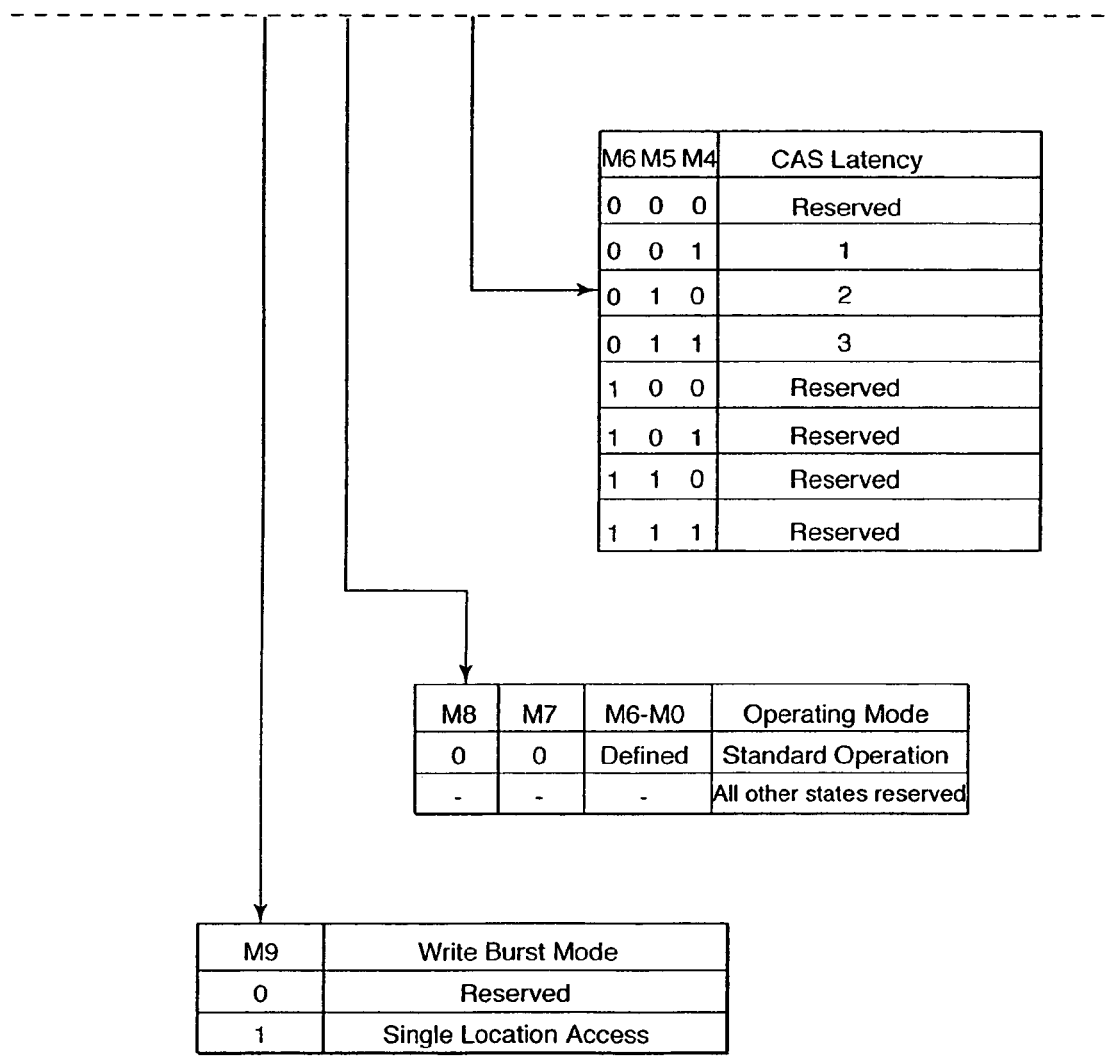

The Mode Register 148 is used to define the specific mode of operation of the synchronous flash memory. This definition includes the selection of a burst length, a burst type, a CAS latency, and an operating mode, as shown in FIG. 2. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Mode Register bits M0-M2 specify a burst length, M3 specifies a burst type (sequential or interleaved), M4-M6 specify a CAS latency, M7 and M8 specify a operating mode, M9 is set to one, and M10 and M11 are reserved in this embodiment. Because WRITE bursts are not currently implemented, M9 is set to a logic one and write accesses are single location (non-burst) accesses. The Mode Register must be loaded when all banks are idle, and the controller must wait the specified time before initiating a subsequent operation.

Read accesses to the synchronous flash memory can be burst oriented, with the burst length being programmable, as shown in Table 1. The burst length determines the maximum number of column locations that can be automatically accessed for a given READ command. Burst lengths of 1, 2, 4, or 8 locations are available for both sequential and the interleaved burst types, and a full-page burst is available for the sequential type. The full-page burst can be used in conjunction with the BURST TERMINATE command to generate arbitrary burst lengths that is, a burst can be selectively terminated to provide custom length bursts. When a READ command is issued, a block of columns equal to the burst length is effectively selected. All accesses for that burst take place within this block, meaning that the burst will wrap within the block if a boundary is reached. The block is uniquely selected by A1-A7 when the burst length is set to two, by A2-A7 when the burst length is set to four, and by A3-A7 when the burst length is set to eight. The remaining (least significant) address bit(s) are used to select the starting location within the block. Full-page bursts wrap within the page if the boundary is reached.

Accesses within a given burst may be programmed to be either sequential or interleaved; this is referred to as the burst type and is selected via bit M3. The ordering of accesses within a burst is determined by the burst length, the burst type and the starting column address, as shown in Table 1.

TABLE 1

BURST DEFINITION

| Burst Length | Starting Column Address | | | Type = Sequential | Type = Interleaved |
|---|---|---|---|---|---|
| | A2 | A1 | A0 | Order of Accesses Within a Burst | |
| 2 | | | 0 | 0-1 | 0-1 |
| | | | 1 | 1-0 | 1-0 |
| 4 | | 0 | 0 | 0-1-2-3 | 0-1-2-3 |
| | | 0 | 1 | 1-2-3-0 | 1-0-3-2 |
| | | 1 | 0 | 2-3-0-1 | 2-3-0-1 |
| | | 1 | 1 | 3-0-1-2 | 3-2-1-0 |
| 8 | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |
| Full Page 256 | n = A0–A7 (location 0-255) | | | Cn, Cn + 1, Cn + 2 Cn + 3, Cn + 4 ... Cn – 1, Cn ... | Not supported |

The following truth table provides more detail of some operation commands relating to protection of the memory array according to an embodiment of the memory of the present invention.

location from over-erasure and optimizes each memory location for maximum data retention. In addition, the ISM greatly simplifies the control necessary for writing the device in-system or in an external programmer.

The synchronous flash memory is organized into 16 independently erasable memory blocks that allow portions of the memory to be erased without affecting the rest of the memory data. Any block may be hardware-protected against inadvertent erasure or writes. A protected block requires that the RP# pin be driven to VHH (a relatively high voltage) before being modified. The 256K-word blocks at locations 0 and 15 can have additional hardware protection. Once a PROTECT BLOCK command has been executed to these blocks, an UNPROTECT ALL BLOCKS command will unlock all blocks except the blocks at locations 0 and 15, unless the RP# pin is at VHH. This provides additional security for critical code during in-system firmware updates, should an unintentional power disruption or system reset occur.

Power-up initialization, ERASE, WRITE and PROTECT timings are simplified by using an ISM to control all programming algorithms in the memory array. The ISM ensures protection against over-erasure and optimizes write margin to each cell. During WRITE operations, the ISM automatically increments and monitors WRITE attempts, verifies write margin on each memory cell and updates the ISM Status Register. When a BLOCK ERASE operation is performed, the ISM automatically Overwrites the entire addressed block (eliminates over-erasure), increments and monitors ERASE attempts and sets bits in the ISM Status Register.

TRUTH TABLE 1

Flash Memory Command Sequences

| | 1st CYCLE | | | | | 2nd CYCLE | | | | | 3rd CYCLE | | | | |
|---|---|---|---|---|---|---|---|---|---|---|---|---|---|---|---|
| Operation | CMD | ADDR | ADDR | DQ | RP# | CMD | ADDR | ADDR | DQ | RP# | CMD | ADDR | ADDR | DQ | RP# |
| Protect Block/Confirm | LCR | 60H | Bank | X | H | ACTIVE | Row | Bank | X | H | WRITE | X | Bank | 01H | H/V$_{HH}$ |
| Protect Device/Confirm | LCR | 60H | Bank | X | H | ACTIVE | X | Bank | X | H | WRITE | X | Bank | F1H | V$_{HH}$ |
| Unprotect Blocks/Confirm | LCR | 60H | Bank | X | H | ACTIVE | X | Bank | X | H | WRITE | X | Bank | D0H | H/V$_{HH}$ |

Function Description

The synchronous flash memory incorporates a number of features to make it ideally suited for code storage and execute-in-place applications on an SDRAM bus. The memory array is segmented into individual erase blocks. Each block may be erased without affecting data stored in other blocks. These memory blocks are read, written and erased by issuing commands to the command execution logic 130 (CEL). The CEL controls the operation of the Internal State Machine 132 (ISM), which completely controls all ERASE NVMODE REGISTER, WRITE NVMODE REGISTER, WRITE, BLOCK ERASE, BLOCK PROTECT, DEVICE PROTECT, UNPROTECT ALL BLOCKS and VERIFY operations. The ISM 132 protects each memory The 8-bit ISM Status Register 134 allows an external processor 200, or memory controller, to monitor the status of the ISM during WRITE, ERASE and PROTECT operations. One bit of the 8-bit Status Register (SR7) is set and cleared entirely by the ISM. This bit indicates whether the ISM is busy with an ERASE, WRITE or PROTECT task. Additional error information is set in three other bits (SR3, SR4 and SR5): write and protect block error, erase and unprotect all blocks error, and device protection error. Status register bits SR0, SR1 and SR2 provide details on the ISM operation underway. The user can monitor whether a device-level or bank-level ISM operation (including which bank is under ISM control) is underway. These six bits (SR3-SR5) must be cleared by the host system. Table 2 illustrates one embodiment of the status register.

TABLE 2

STATUS REGISTER

| STATUS BIT# | STATUS REGISTER BIT | DESCRIPTION |
|---|---|---|
| SR7 | ISM STATUS<br>1 = Ready<br>0 = Busy | The ISMS bit displays the active status of the state machine when performing WRITE or BLOCK ERASE. The controlling logic polls this bit to determine when the erase and write status bits are valid. |
| SR6 | RESERVED | Reserved for future use. |
| SR5 | ERASE/UNPROTECT BLOCK STATUS<br>1 = BLOCK ERASE or BLOCK UNPROTECT error<br>0 = Successful BLOCK ERASE or UNPROTECT | ES is set to 1 after the maximum number of ERASE cycles is executed by the ISM without a successful verify. This bit is also set to 1 if a BLOCK UNPROTECT operation is unsuccessful. ES is only cleared by a CLEAR STATUS REGISTER command or by a RESET. |
| SR4 | WRITE/PROTECT BLOCK STATUS<br>1 = WRITE or BLOCK PROTECT error<br>0 = Successful WRITE or BLOCK PROTECT | WS is set to 1 after the maximum number of WRITE cycles is executed by the ISM without a successful verify. This bit is also set to 1 if a BLOCK or DEVICE PROTECT operation is unsuccessful. WS is only cleared by a CLEAR STATUS REGISTER command or by a RESET. |
| SR2<br>SR1 | BANKA1 ISM STATUS<br>BANKA0 ISM STATUS | When SR0 = 0, the bank under ISM control can be decoded from BA0, BA1: [0, 0] Bank0; [0, 1] Bank1; [1, 0] Bank2; [1, 1] Bank3. |
| SR3 | DEVICE PROTECT STATUS<br>1 = Device protected, invalid operation attempted<br>0 = Device unprotected or RP# condition met | DPS is set to 1 if an invalid WRITE, ERASE, PROTECT BLOCK, PROTECT DEVICE or UNPROTECT ALL BLOCKS is attempted. After one of these commands is issued, the condition of RP#, the block protect bit and the device protect bit are compared to determine if the desired operation is allowed. Must be cleared by CLEAR STATUS REGISTER or by a RESET. |
| SR0 | DEVICE/BANK ISM STATUS<br>1 = Device level ISM operation<br>0 = Bank level ISM operation | DBS is set to 1 if the ISM operation is a device-level operation. A valid READ to any bank of the array can immediately follow the registration of a device-level ISM WRITE operation. When DBS is set to 0, the ISM operation is a bank-level operation. A READ to the bank under ISM control may result in invalid data. SR2 and SR3 can be decoded to determine which bank is under ISM control. |

To allow for maximum power conservation, the synchronous flash features a very low current, deep power-down mode. To enter this mode, the RP# pin 140 (reset/power-down) is taken to VSS ±0.2V. To prevent an inadvertent RESET, RP# must be held at Vss for 100 ns prior to the device entering the reset mode. With RP# held at Vss, the device will enter the deep power-down mode. After the device enters the deep power-down mode, a transition from LOW to HIGH on RP# will result in a device power-up initialize sequence as outlined herein. Transitioning RP# from LOW to HIGH after entering the reset mode but prior to entering deep power-down mode requires a 1 µs delay prior to issuing an executable command. When the device enters the deep power-down mode, all buffers excluding the RP# buffer are disabled and the current draw is low, for example, a maximum of 50 µA at 3.3V VCC. The input to RP# must remain at Vss during deep power-down. Entering the RESET mode clears the Status Register 134 and sets the ISM 132 to the array read mode.

The synchronous flash memory array architecture is designed to allow sectors to be erased without disturbing the rest of the array. The array is divided into 16 addressable "blocks" that are independently erasable. By erasing blocks rather than the entire array, the total device endurance is enhanced, as is system flexibility. Only the ERASE and BLOCK PROTECT functions are block oriented. The 16 addressable blocks are equally divided into four banks 104, 106, 108 and 110 of four blocks each. The four banks have simultaneous read-while-write functionality. An ISM WRITE or ERASE operation to any bank can occur simultaneously to a READ operation to any other bank. The Status Register 134 may be polled to determine which bank is under ISM operation. The synchronous flash memory has a single background operation ISM to control power-up initialization, ERASE, WRITE, and PROTECT operations. Only one ISM operation can occur at any time; however, certain other commands, including READ operations, can be performed while the ISM operation is taking place. An operational command controlled by the ISM is defined as either a bank-level operation or a device-level operation. WRITE and ERASE are bank-level ISM operations. After an ISM bank operation has been initiated, a READ to any location in the bank may output invalid data, whereas a READ to any other bank will read the array. A READ STATUS REGISTER command will output the contents of the Status Register 134. The ISM status bit will indicate when the ISM operation is complete (SR7=1). When the ISM operation is complete, the bank will automatically enter the array read mode. ERASE NVMODE REGISTER, WRITE NVMODE REGISTER, BLOCK PROTECT, DEVICE PROTECT, and UNPROTECT ALL BLOCKS are device-level ISM operations. Once an ISM device-level operation has been initiated, a READ to any bank will output the contents of the array. A READ STATUS REGISTER command may be issued to determine completion of the ISM operation. When SR7=1, the ISM operation will be complete and a subsequent ISM operation may be initiated. Any block may be protected from unintentional ERASE or WRITE with a hardware circuit that requires the RP# pin be driven to VHH before a WRITE or ERASE is commenced, as explained below.

Any block may be hardware-protected to provide extra security for the most sensitive portions of the firmware. During a WRITE or ERASE of a hardware protected block, the RP# pin must be held at VHH until the WRITE or ERASE is completed. Any WRITE or ERASE attempt on a protected block without RP#=VHH will be prevented and will result in a write or erase error. The blocks at locations 0 and 15 can have additional hardware protection to prevent an inadvertent WRITE or ERASE operation. In this embodiment, these blocks cannot be software-unlocked through an UNPROTECT ALL BLOCKS command unless RP#=VHH. The protection status of any block may be checked by reading its block protect bit with a READ STATUS REGISTER command. Further, to protect a block, a three-cycle command sequence must be issued with the block address.

The device protection status and block protect status can be read by issuing a READ DEVICE CONFIGURATION (90H) command. To read the desired register, a specific address must be asserted. While in this mode, specific addresses are issued to read the desired information. The device protect bit is read at 000003H, and each of the block protect bits is read at the third address location within each block (xx0002H). The device and block protect bits are output on DQ0. See Table 3 for more details on some of the various device configuration registers 136.

TABLE 3

DEVICE CONFIGURATION

| Device Configuration | Address | Data | CONDITION |
|---|---|---|---|
| Block Protect Bit | xx0002H | DQ0 = 1 | Block protected |
|  | xx0002H | DQ0 = 0 | Block unprotected |
| Device Protect Bit | 000003H | DQ0 = 1 | Block protect modification prevented |
|  | 000003H | DQ0 = 0 | Block protect modification enabled |

Three consecutive commands on consecutive clock edges are needed to input data to the array (NOPs and Command Inhibits are permitted between cycles). In the first cycle, a LOAD COMMAND REGISTER command is given with WRITE SETUP (40H) on A0-A7, and the bank address is issued on BA0, BA1. The next command is ACTIVE, which activates the row address and confirms the bank address. The third cycle is WRITE, during which the starting column, the bank address, and data are issued. The ISM status bit will be set on the following clock edge (subject to CAS latencies). While the ISM executes the WRITE, the ISM status bit (SR7) will be at 0. A READ operation to the bank under ISM control may produce invalid data. When the ISM status bit (SR7) is set to a logic 1, the WRITE has been completed, and the bank will be in the array read mode and ready for an executable command. Writing to hardware-protected blocks also requires that the RP# pin be set to VHH prior to the third cycle (WRITE), and RP# must be held at VHH until the ISM WRITE operation is complete. The write and erase status bits (SR4 and SR5) will be set if the LCR-ACTIVE-WRITE command sequence is not completed on consecutive cycles or the bank address changes for any of the three cycles. After the ISM has initiated the WRITE, it cannot be aborted except by a RESET or by powering down the part. Doing either during a WRITE may corrupt the data being written.

Executing an ERASE sequence will set all bits within a block to logic 1. The command sequence necessary to execute an ERASE is similar to that of a WRITE. To provide added security against accidental block erasure, three consecutive command sequences on consecutive clock edges are required to initiate an ERASE of a block. In the first cycle, LOAD COMMAND REGISTER is given with ERASE SETUP (20H) on A0-A7, and the bank address of the block to be erased is issued on BA0, BA1. The next command is ACTIVE, where A10, A11, BA0, BA1 provide the address of the block to be erased. The third cycle is WRITE, during which ERASE CONFRIM (D0H) is given on DQ0-DQ7 and the bank address is reissued. The ISM status bit will be set on the following clock edge (subject to CAS latencies). After ERASE CONFIRM (D0H) is issued, the ISM will start the ERASE of the addressed block. Any READ operation to the bank where the addressed block resides may output invalid data. When the ERASE operation is complete, the bank will be in the array read mode and ready for an executable command. Erasing hardware-protected blocks also requires that the RP# pin be set to VHH prior to the third cycle (WRITE), and RP# must be held at VHH until the ERASE is completed (SR7=1). If the LCR-ACTIVE-WRITE command sequence is not completed on consecutive cycles (NOPs and COMMAND INHIBITs are permitted between cycles) or the bank address changes for one or more of the command cycles, the write and erase status bits (SR4 and SR5) will be set and the operation is prohibited.

Executing a BLOCK PROTECT sequence enables the first level of software/hardware protection for a given block. The memory includes a 16-bit register that has one bit corresponding to the 16 protectable blocks. The memory also has a register to provide a device bit used to protect the entire device from write and erase operations. The command sequence necessary to execute a BLOCK PROTECT is similar to that of a WRITE. To provide added security against accidental block protection, three consecutive command cycles are required to initiate a BLOCK PROTECT. In the first cycle, a LOAD COMMAND REGISTER is issued with a PROTECT SETUP (60H) command on A0-A7, and the bank address of the block to be protected is issued on BA0, BA1. The next command is ACTIVE, which activates a row in the block to be protected and confirms the bank address. The third cycle is WRITE, during which BLOCK PROTECT CONFIRM (OH) is issued on DQ0-DQ7, and the bank address is reissued. The ISM status bit will be set on the following clock edge (subject to CAS latencies). The ISM will then begin the PROTECT operation. If the LCR-ACTIVE-WRITE is not completed on consecutive cycles (NOPs and COMMAND INHIBITs are permitted between cycles) or the bank address changes, the write and erase status bits (SR4 and SR5) will be set and the operation is prohibited. When the ISM status bit (SR7) is set to a logic 1, the PROTECT has been completed, and the bank will be in the array read mode and ready for an executable command. Once a block protect bit has been set to a 1 (protected), it can only be reset to a 0 if the UNPROTECT ALL BLOCKS command. The UNPROTECT ALL BLOCKS command sequence is similar to the BLOCK PROTECT command; however, in the third cycle, a WRITE is issued with a UNPROTECT ALL BLOCKS CONFIRM (D0H) command and addresses are "Don't Care."

The blocks at locations 0 and 15 have additional security. Once the block protect bits at locations 0 and 15 have been set to a 1 (protected), each bit can only be reset to a 0 if RP# is brought to VHH prior to the third cycle of the UNPROTECT operation, and held at VHH until the operation is complete (SR7=1). Further, if the device protect bit is set, RP# must be brought to VHH prior to the third cycle and held at VHH until the BLOCK PROTECT or UNPROTECT ALL BLOCKS operation is complete. To check a block's protect status, a READ DEVICE CON FIGURATION (90H) command may be issued.

Executing a DEVICE PROTECT sequence sets the device protect bit to a 1 and prevents a block protect bit modification. The command sequence necessary to execute a DEVICE PROTECT is similar to that of a WRITE. Three consecutive command cycles are required to initiate a DEVICE PROTECT sequence. In the first cycle, LOAD COMMAND REGISTER is issued with a PROTECT SETUP (60H) on A0-A7, and a bank address is issued on BA0, BA1. The bank address is "Don't Care" but the same bank address must be used for all three cycles. The next command is ACTIVE. The third cycle is WRITE, during which a DEVICE PROTECT (F1H) command is issued on DQ0-DQ7, and RP# is brought to VHH. The ISM status bit will be set on the following clock edge (subject to CAS latencies). An executable command can be issued to the device. RP# must be held at VHH until the WRITE is completed (SR7=1). A new WRITE operation will not be permitted until the current ISM operation is complete. Once the device protect bit is set, it cannot be reset to a 0. With the device protect bit set to a 1, BLOCK PROTECT or BLOCK UNPROTECT is prevented unless RP# is at VHH during either operation. The device protect bit does not affect WRITE or ERASE operations. Refer to Table 4 for more information on block and device protect operations.

TABLE 4

PROTECT OPERATIONS TRUTH TABLE

| FUNCTION | RP# | CS# | DQM | WE# | Address | Vccp | DQ0-DQ7 |
|---|---|---|---|---|---|---|---|
| DEVICE UNPROTECTED | | | | | | | |
| PROTECT SETUP | H | L | H | L | 60H | X | X |
| PROTECT BLOCK | H | L | H | L | BA | H | 01H |
| PROTECT DEVICE | V$_{HH}$ | L | H | L | X | X | F1H |
| UNPROTECT ALL BLOCKS | H/V$_{HH}$ | L | H | L | X | H | D0H |

TABLE 4-continued

PROTECT OPERATIONS TRUTH TABLE

| FUNCTION | RP# | CS# | DQM | WE# | Address | Vccp | DQ0-DQ7 |
|---|---|---|---|---|---|---|---|
| DEVICE PROTECTED | | | | | | | |
| PROTECT SETUP | H or V$_{HH}$ | L | H | L | 60H | X | X |
| PROTECT BLOCK | V$_{HH}$ | L | H | L | BA | H | 01H |
| UNPROTECT ALL BLOCKS | V$_{HH}$ | L | H | L | X | H | D0H |

After the state machine status register bit (SR7) has been set, the device/bank (SR0), device protect (SR3), bankA0 (SR1), bankA1 (SR2), write/protect block (SR4) and erase/unprotect (SR5) status bits may be checked. If one or a combination of SR3, SR4, SR5 status bits has been set, an error has occurred during operation. The ISM cannot reset the SR3, SR4 or SR5 bits. To clear these bits, a CLEAR STATUS REGISTER (50H) command must be given. Table 5 lists some combinations of errors.

TABLE 5

STATUS REGISTER ERROR DECODE

| STATUS BITS | | | |
|---|---|---|---|
| SR5 | SR4 | SR3 | ERROR DESCRIPTION |
| 0 | 0 | 0 | No errors |
| 0 | 1 | 0 | WRITE, BLOCK PROTECT or DEVICE PROTECT error |
| 0 | 1 | 1 | Invalid BLOCK PROTECT or DEVICE PROTECT, RP# not valid (V$_{HH}$) |
| 0 | 1 | 1 | Invalid BLOCK or DEVICE PROTECT, RP# not valid |
| 1 | 0 | 0 | ERASE or ALL BLOCK UNPROTECT error |
| 1 | 0 | 1 | Invalid ALL BLOCK UNPROTECT, RP# not valid (V$_{HH}$) |
| 1 | 1 | 0 | Command sequencing error |

Figure 3:
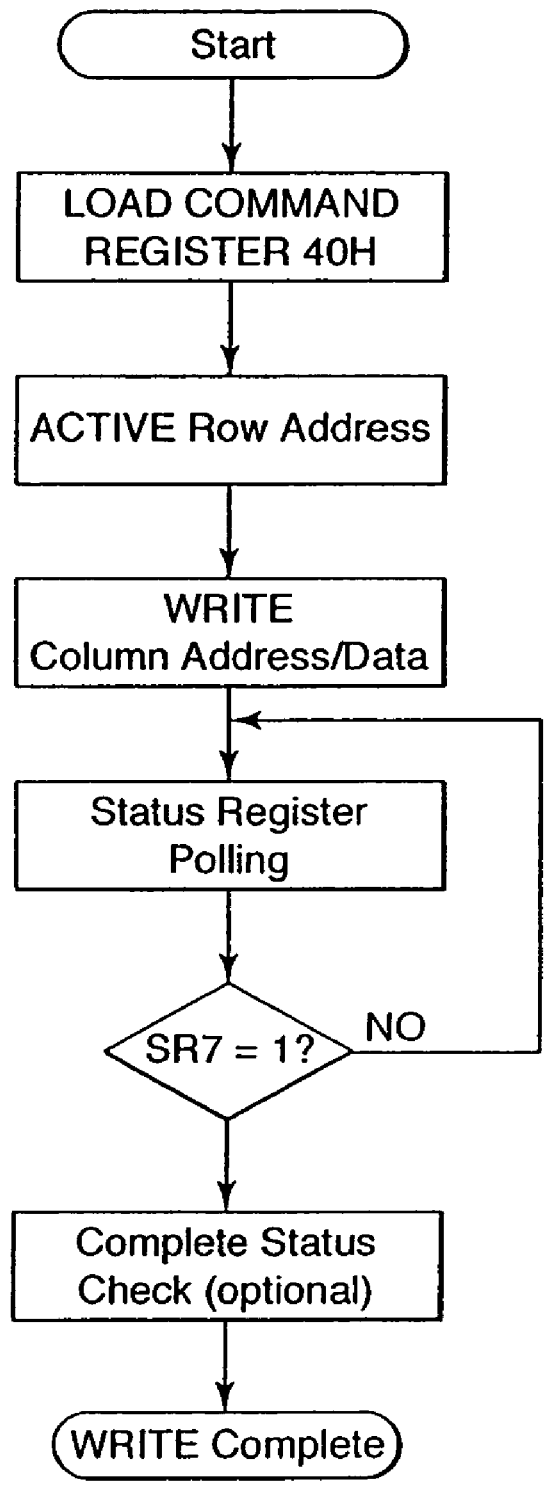
FIG. 3 is a flow chart of a self-timed write sequence according to one embodiment of the present invention.

Referring to FIG. 3, a flow chart of a self-timed write sequence according to one embodiment of the present invention is described. The sequence includes loading the command register (code 40H), receiving an active command and a row address, and receiving a write command and a column address. The sequence then provides for a status register polling to determine if the write is complete. The polling monitors status register bit 7 (SR7) to determine if it is set to a 1. An optional status check can be included. When the write is completed, the array is placed in the array read mode.

Figure 4:
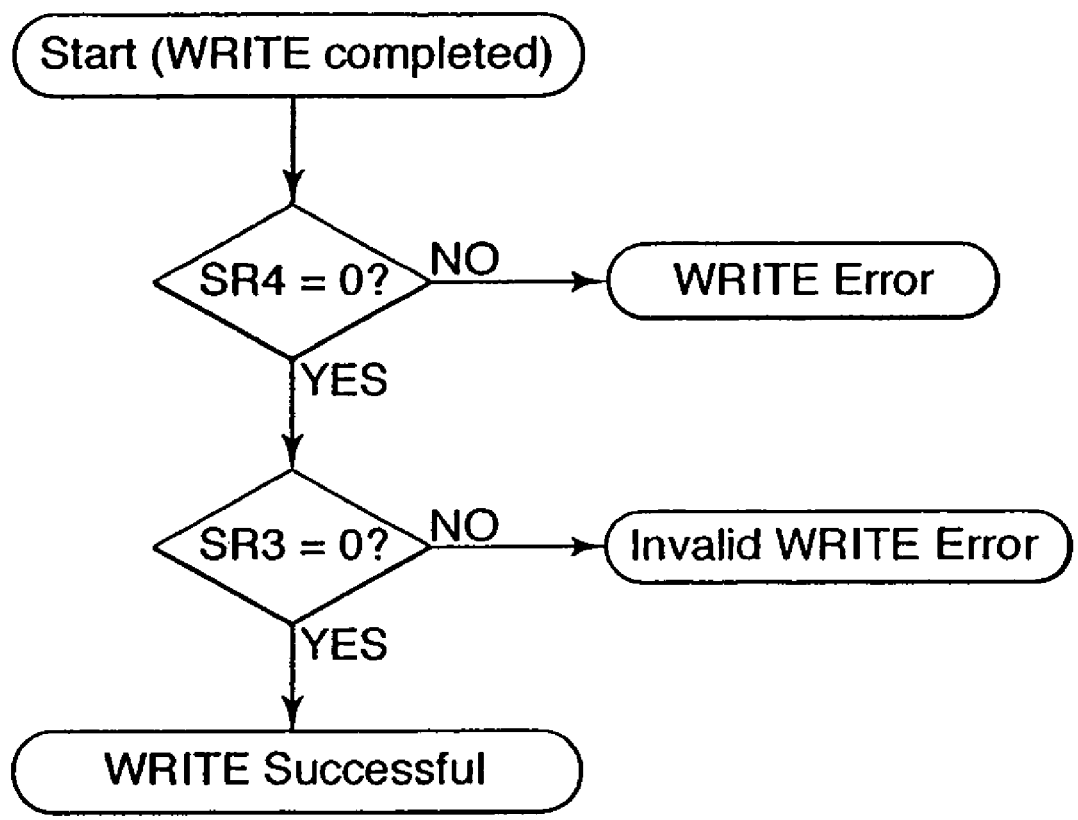
FIG. 4 is a flow chart of a complete write status-check sequence according to one embodiment of the present invention.

Referring to FIG. 4, a flow chart of a complete write status-check sequence according to one embodiment of the present invention is provided. The sequence looks for status register bit 4 (SR4) to determine if it is set to a 0. If SR4 is a 1, there was an error in the write operation. The sequence also looks for status register bit 3 (SR3) to determine if it is set to a 0. If SR3 is a 1, there was an invalid write error during the write operation.

Figure 5:
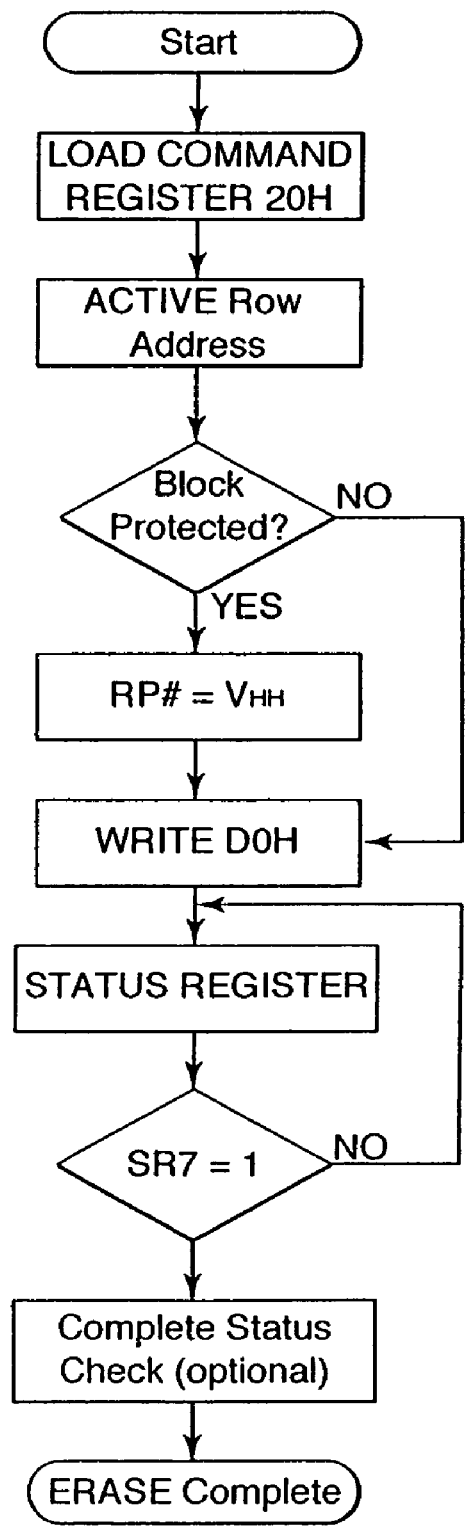
FIG. 5 is a flow chart of a self-timed block erase sequence according to one embodiment of the present invention.

Referring to FIG. 5, a flow chart of a self-timed block erase sequence according to one embodiment of the present invention is provided. The sequence includes loading the command register (code 20H), and receiving an active command and a row address. The memory then determines if the block is protected. If it is not protected, the memory performs a write operation (DOH) to the block and monitors the status register for completion. An optional status check can be performed and the memory is placed in an array read mode. If the block is protected, the erase is not allowed unless the RP# signal is at an elevated voltage (VHH).

Figure 6:
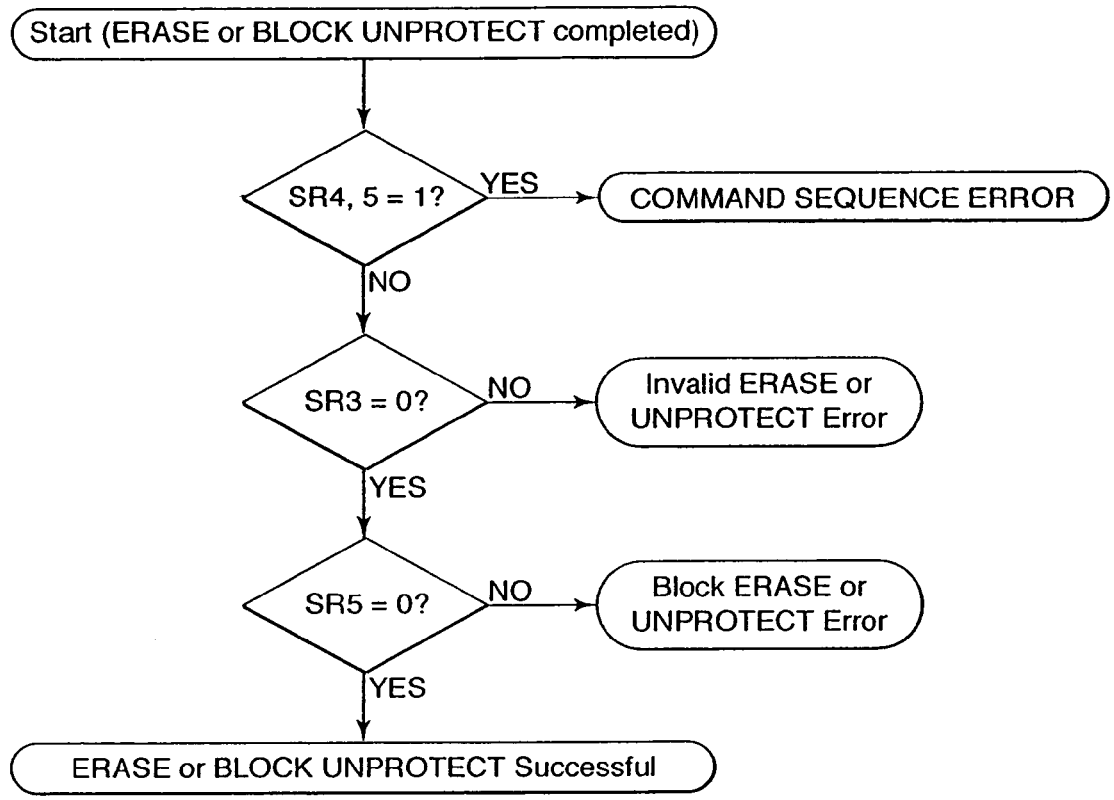
FIG. 6 is a flow chart of a complete block erase status-check sequence according to one embodiment of the present invention.

FIG. 6 illustrates a flow chart of a complete block erase status-check sequence according to one embodiment of the present invention. The sequence monitors the status register to determine if a command sequence error occurred (SR4 or SR5=1). If SR3 is set to a 1, an invalid erase or unprotect error occurred. Finally, a block erase or unprotect error happened if SR5 is set to a 1.

Figure 7:
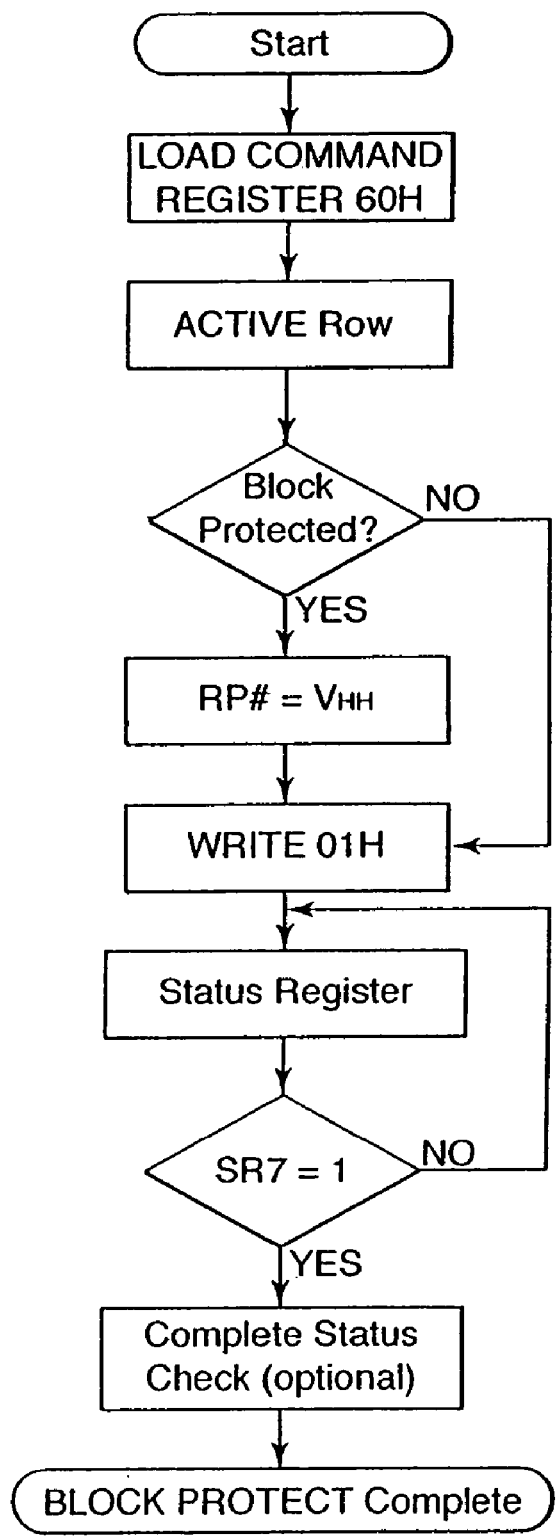
FIG. 7 is a flow chart of a block protect sequence according to one embodiment of the present invention.

FIG. 7 is a flow chart of a block protect sequence according to one embodiment of the present invention. The sequence includes loading the command register (code 60H), and receiving an active command and a row address. The memory then determines if the block is protected. If it is not protected, the memory performs a write operation (01H) to the block and monitors the status register for completion. An optional status check can be performed and the memory is placed in an array read mode. If the block is protected, the erase is not allowed unless the RP# signal is at an elevated voltage (VHH).

Figure 8:
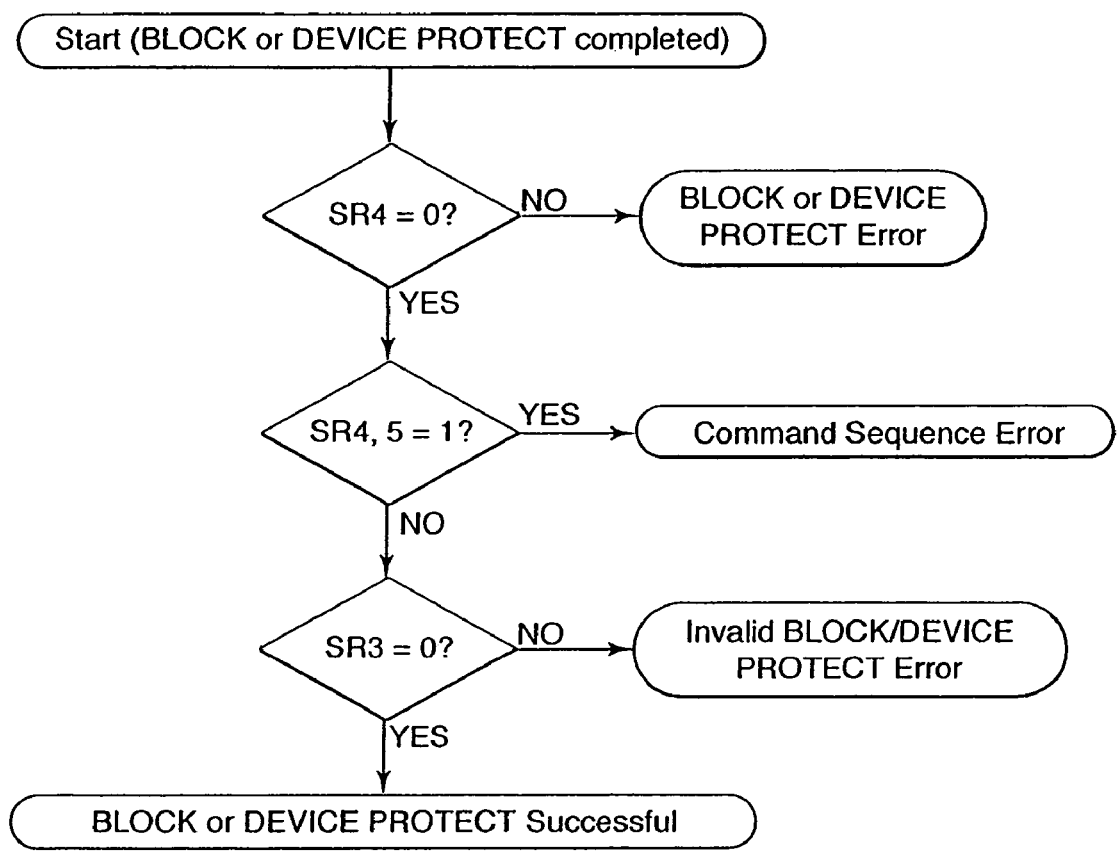
FIG. 8 is a flow chart of a complete block status-check sequence according to one embodiment of the present invention.

Referring to FIG. 8, a flow chart of a complete block status-check sequence according to one embodiment of the present invention is provided. The sequence monitors the status register bits 3, 4 and 5 to determine of errors were detected.

Figure 9:
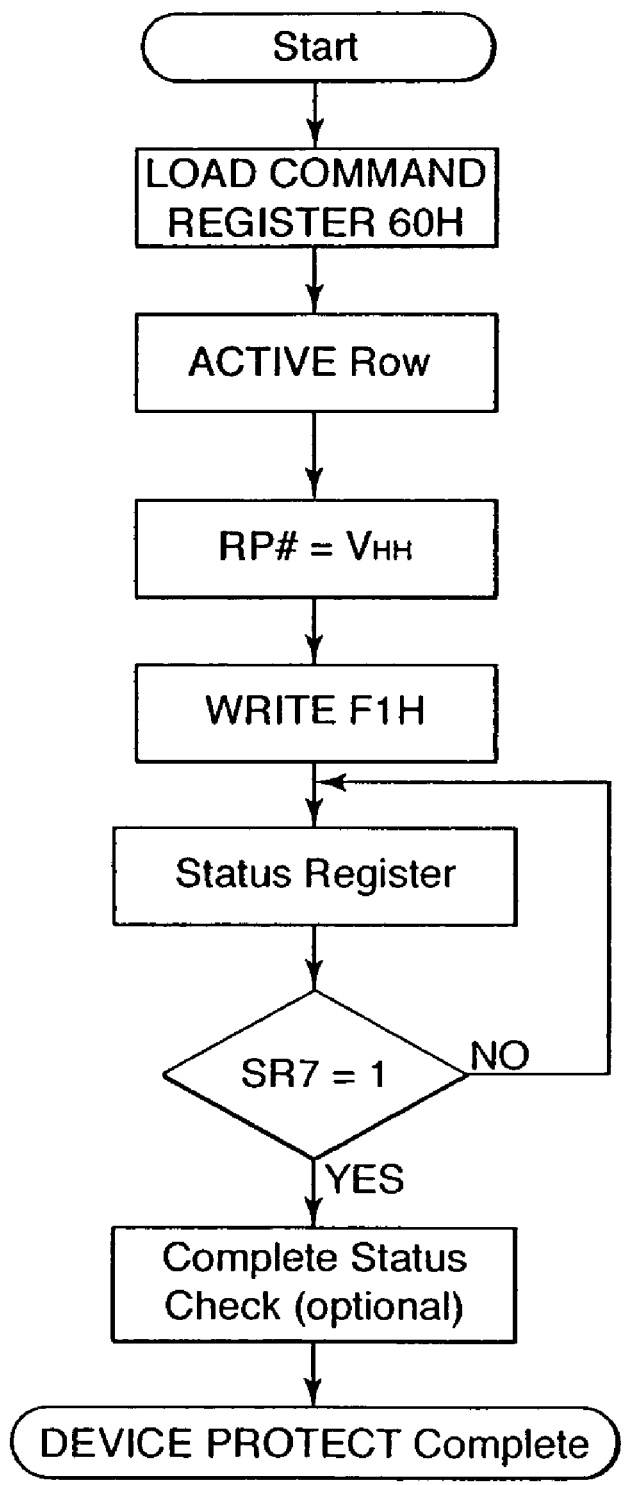
FIG. 9 is a flow chart of a device protect sequence according to one embodiment of the present invention.

FIG. 9 is a flow chart of a device protect sequence according to one embodiment of the present invention. The sequence includes loading the command register (code 60H), and receiving an active command and a row address. The memory then determines if RP# is at VHH. The memory performs a write operation (F1H) and monitors the status register for completion. An optional status check can be performed and the memory is placed in an array read mode.

Figure 10:
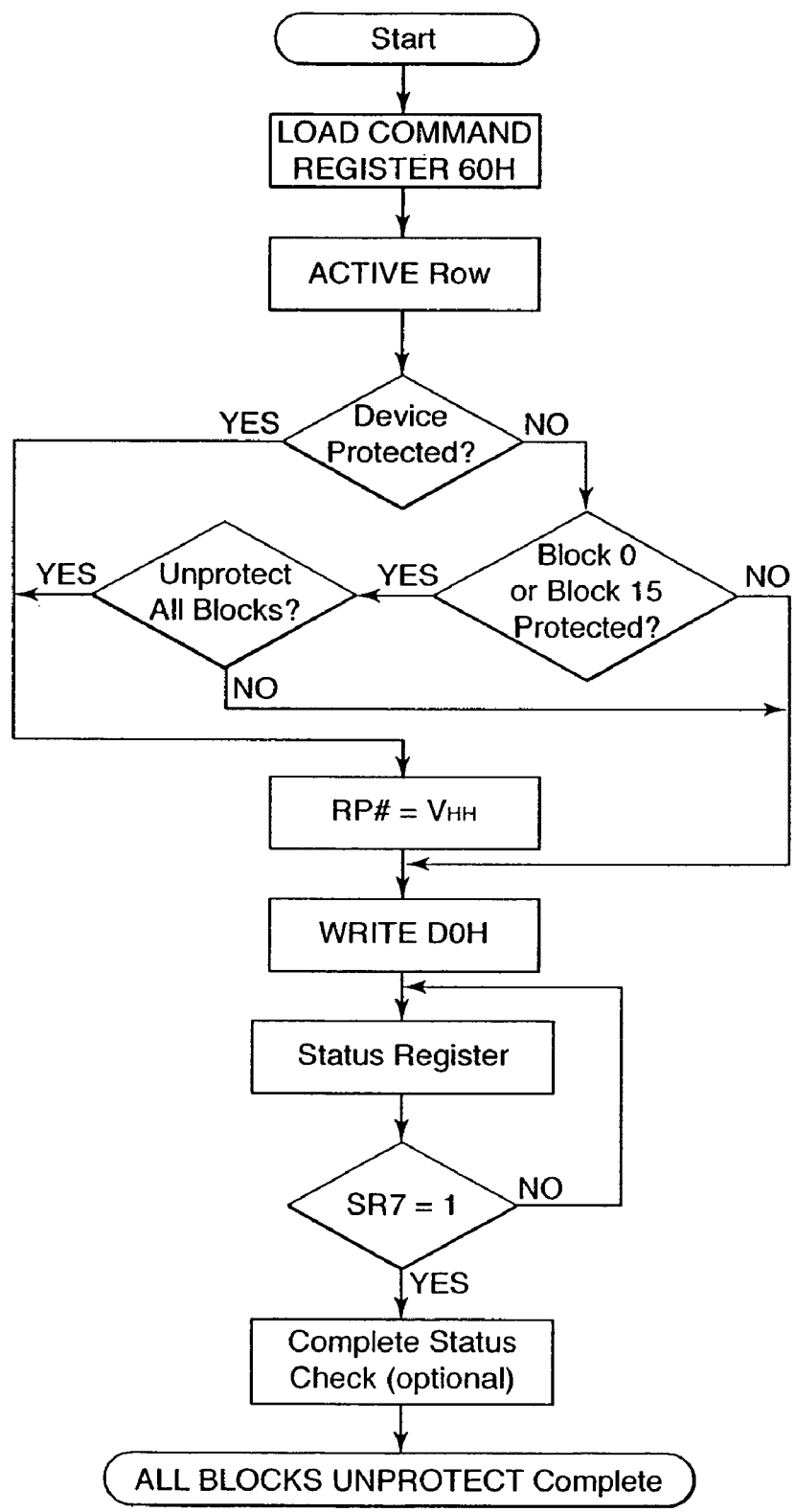
FIG. 10 is a flow chart of a block unprotect sequence according to one embodiment of the present invention.

FIG. 10 is a flow chart of a block unprotect sequence according to one embodiment of the present invention. The sequence includes loading the command register (code 60H), and receiving an active command and a row address. The memory then determines if the memory device is protected. If it is not protected, the memory determines if the boot locations (blocks 0 and 15) are protected. If none of the blocks are protected the memory performs a write operation (DOH) to the block and monitors the status register for completion. An optional status check can be performed and the memory is placed in an array read mode. If the device is protected, the erase is not allowed unless the RP# signal is at an elevated voltage (VHH). Likewise, if the boot locations are protected, the memory determines if all blocks should be unprotected.

Figure 11:
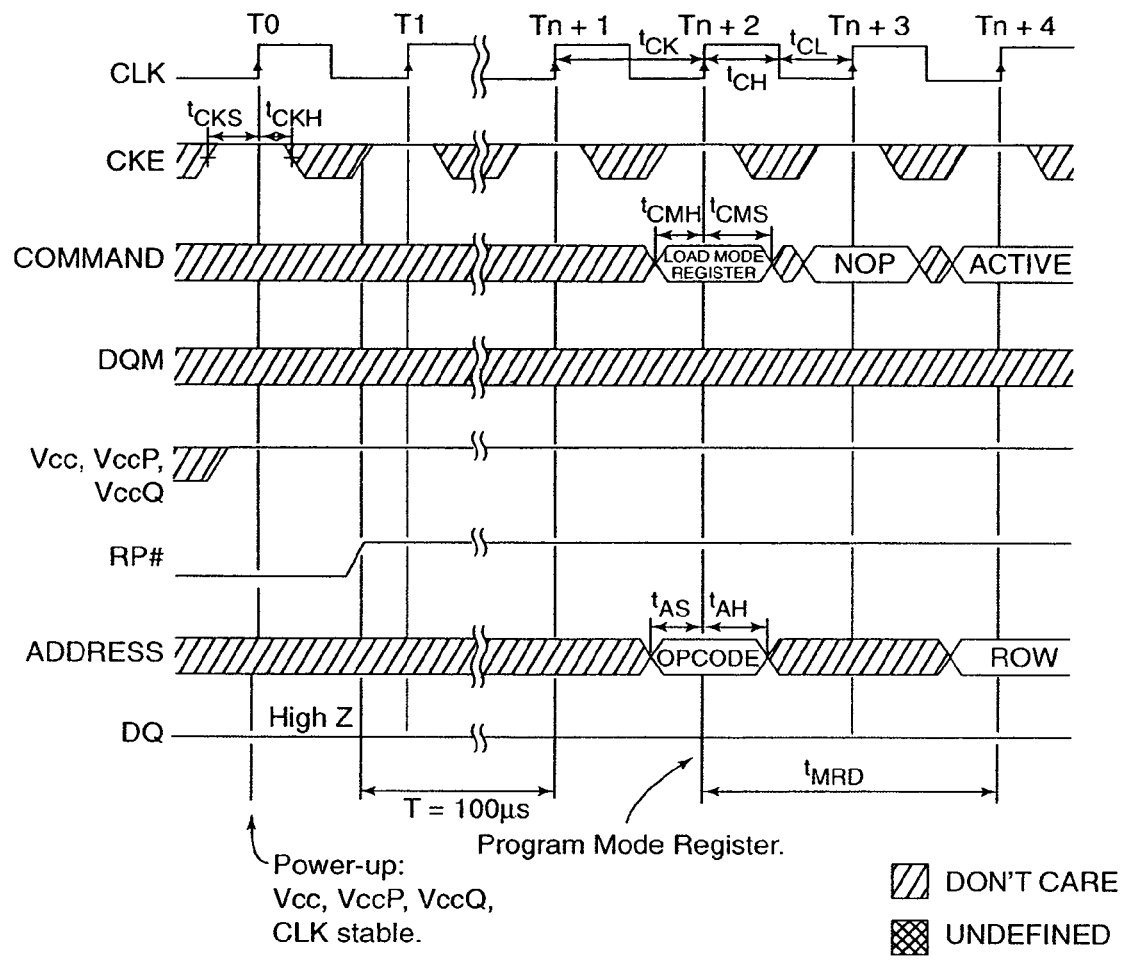
FIG. 11 illustrates the timing of an initialize and load mode register operation.

FIG. 11 illustrates the timing of an initialize and load mode register operation. The mode register is programmed by providing a load mode register command and providing operation code (opcode) on the address lines. The opcode is loaded into the mode register. As explained above, the contents of the non-volatile mode register are automatically loaded into the mode register upon power-up and the load mode register operation may not be needed.

Figure 12:
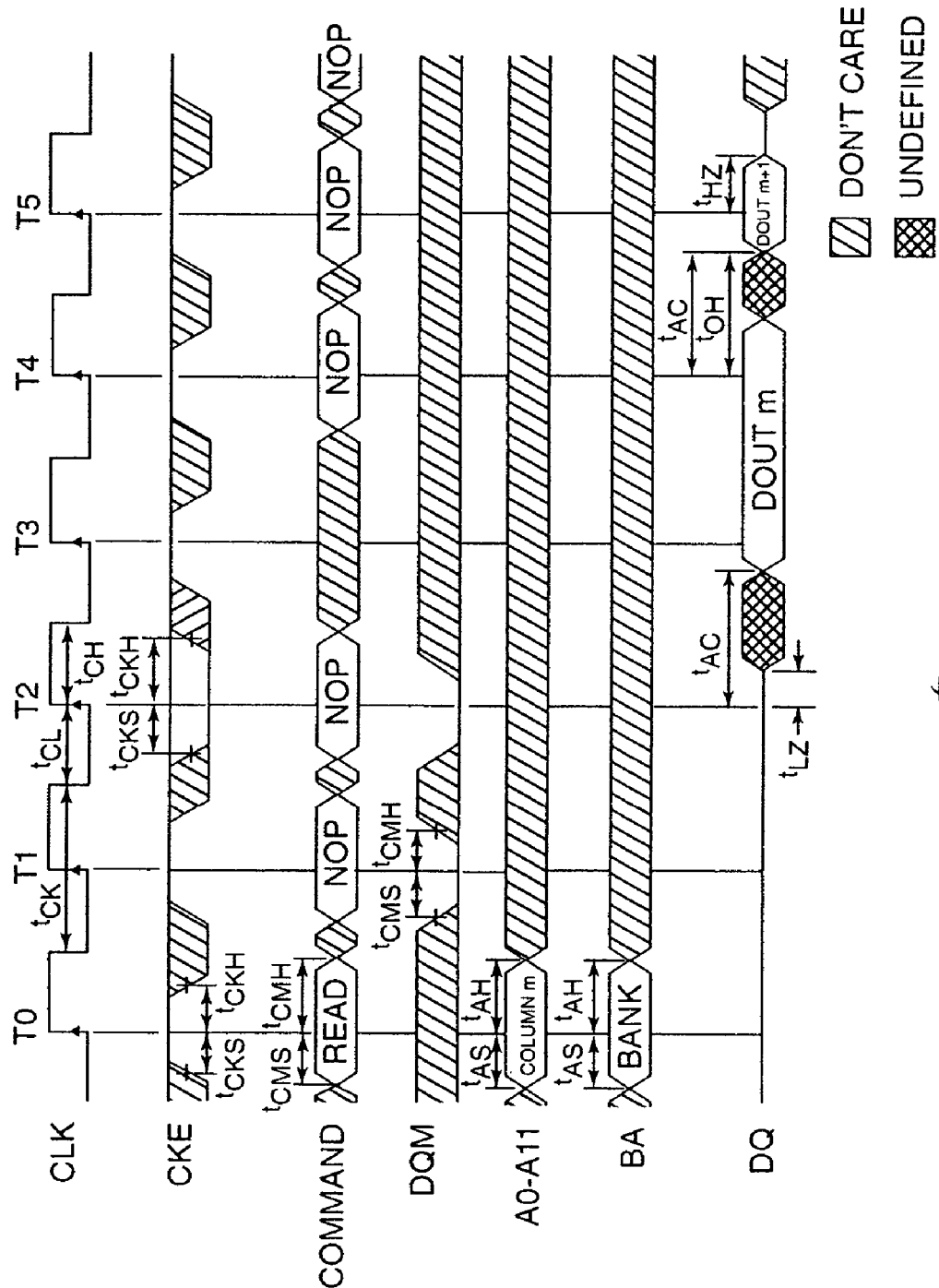
FIG. 12 illustrates the timing of a clock suspend mode operation.
Figure 13:
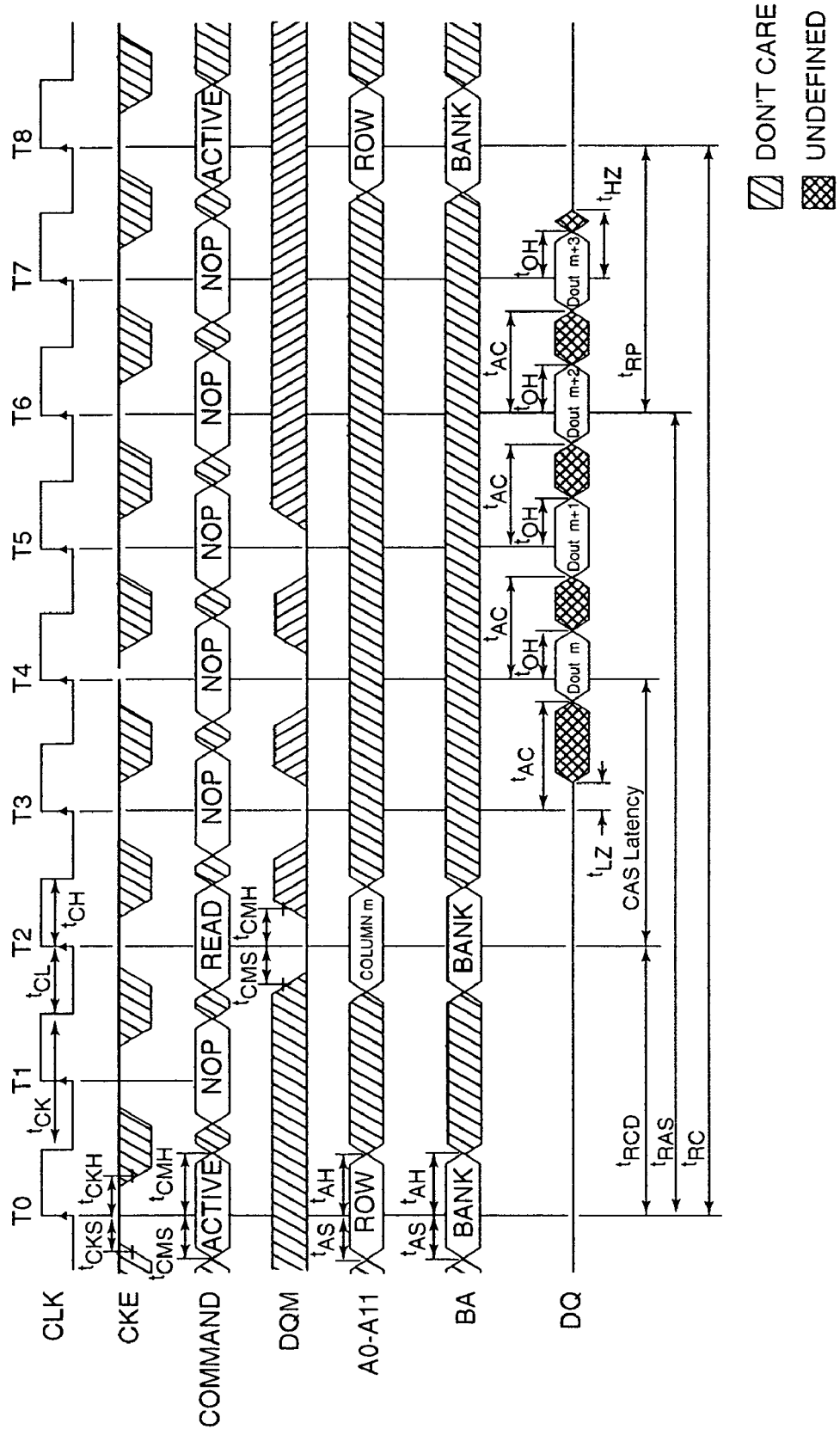
FIG. 13 illustrates the timing of a burst read operation.
Figure 14:
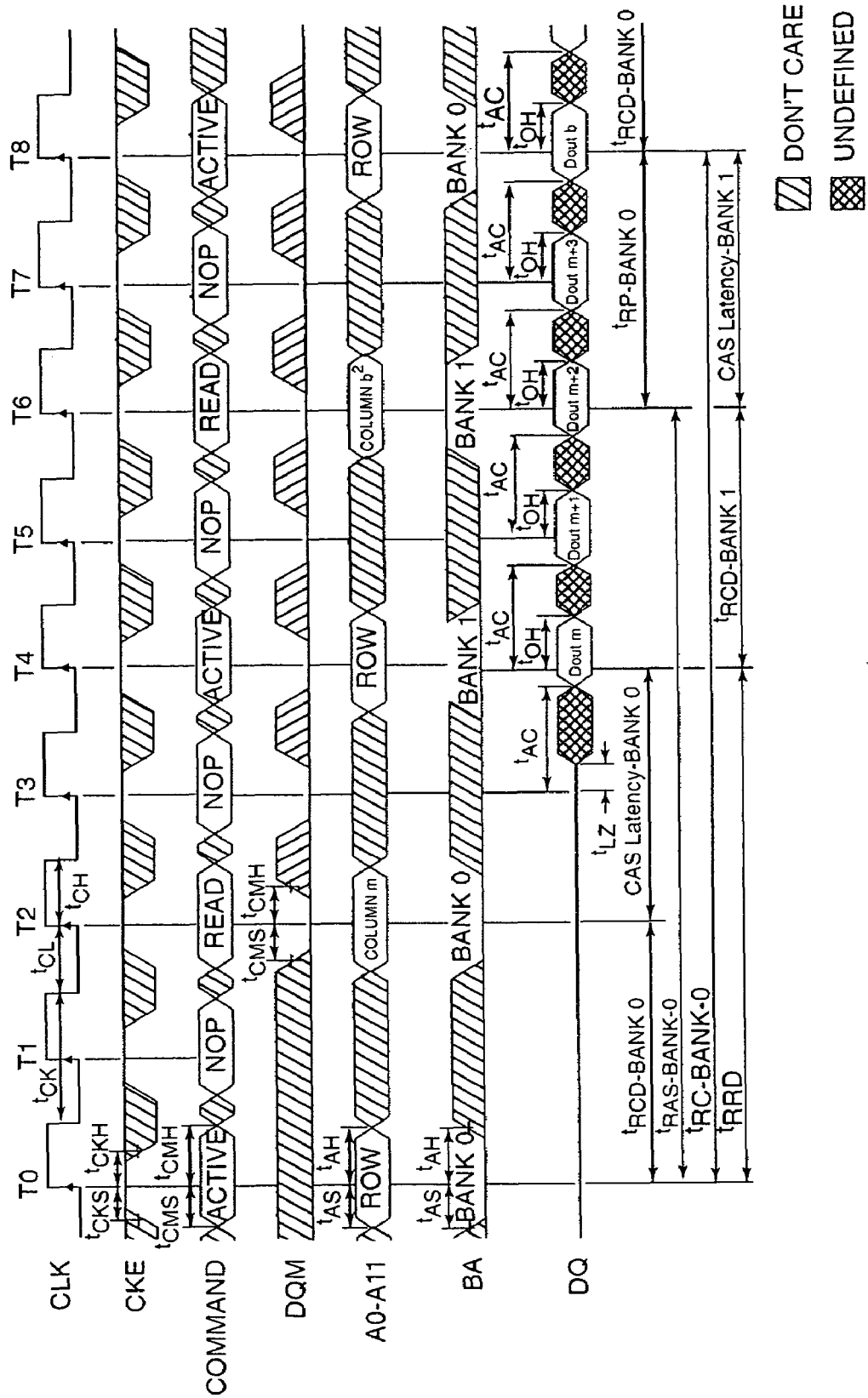
FIG. 14 illustrates the timing of alternating bank read accesses.
Figure 15:
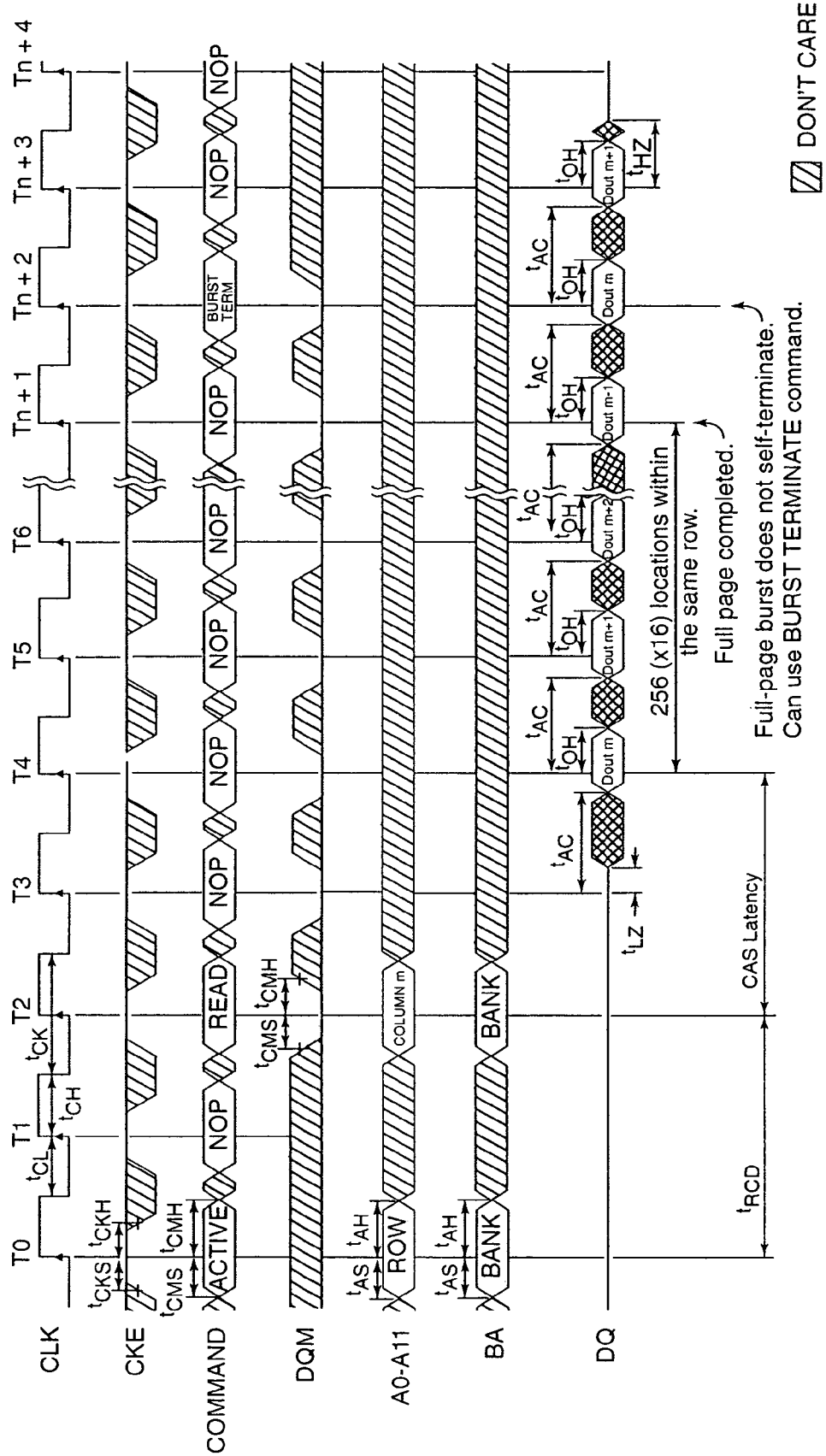
FIG. 15 illustrates the timing of a full-page burst read operation.

FIG. 12 illustrates the timing of a clock suspend mode operation, and FIG. 13 illustrates the timing of another burst read operation. FIG. 14 illustrates the timing of alternating bank read operations. Here active commands are needed to change bank addresses. A full page burst read operation is illustrated in FIG. 15. Note that the full page burst does not self terminate, but requires a terminate command.

Figure 16:
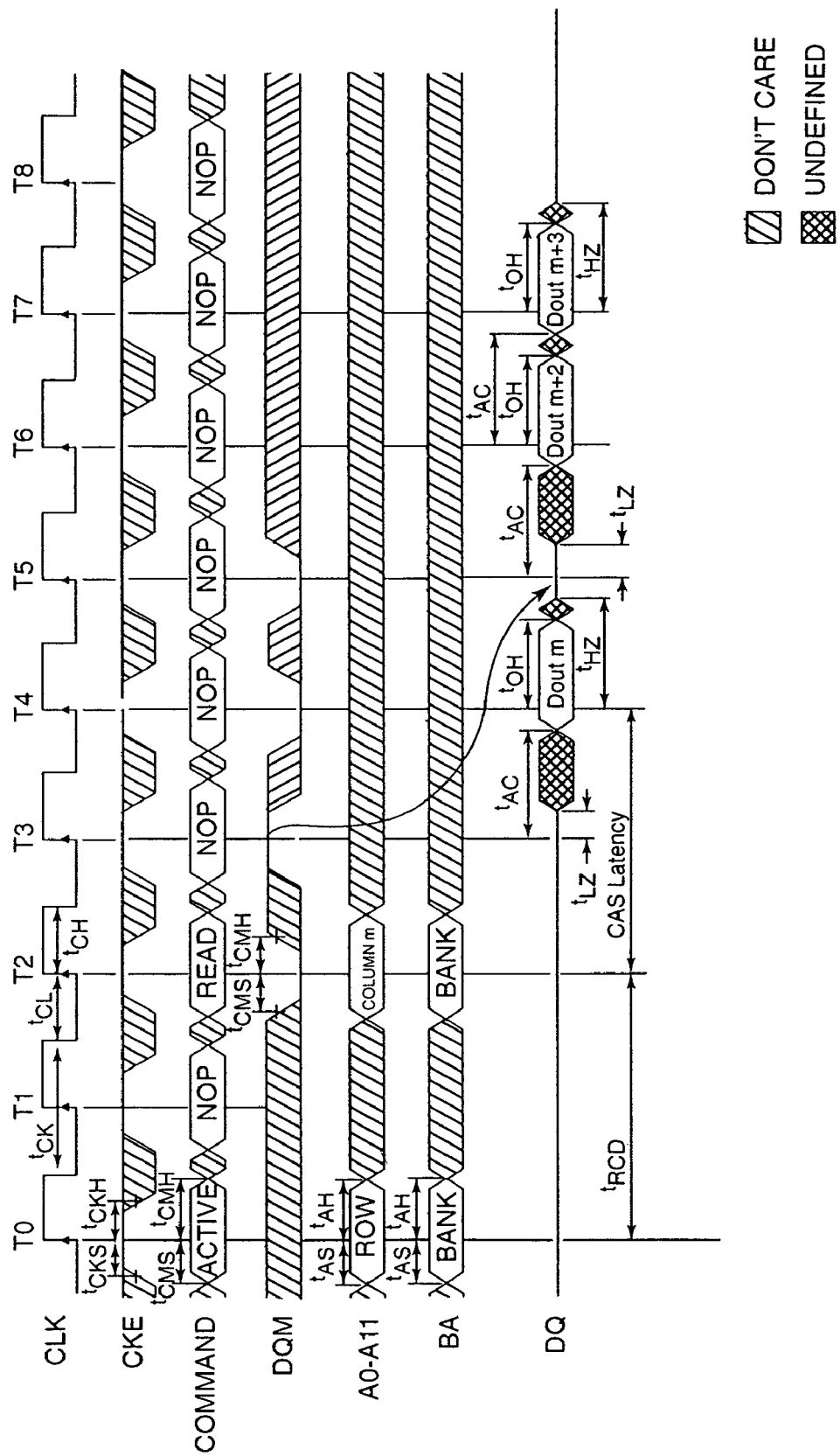
FIG. 16 illustrates the timing of a burst read operation using a data mask signal.

FIG. 16 illustrates the timing of a read operation using a data mask signal. The DQM signal is used to mask the data output so that Dout m+1 is not provided on the DQ connections.

Figure 17:
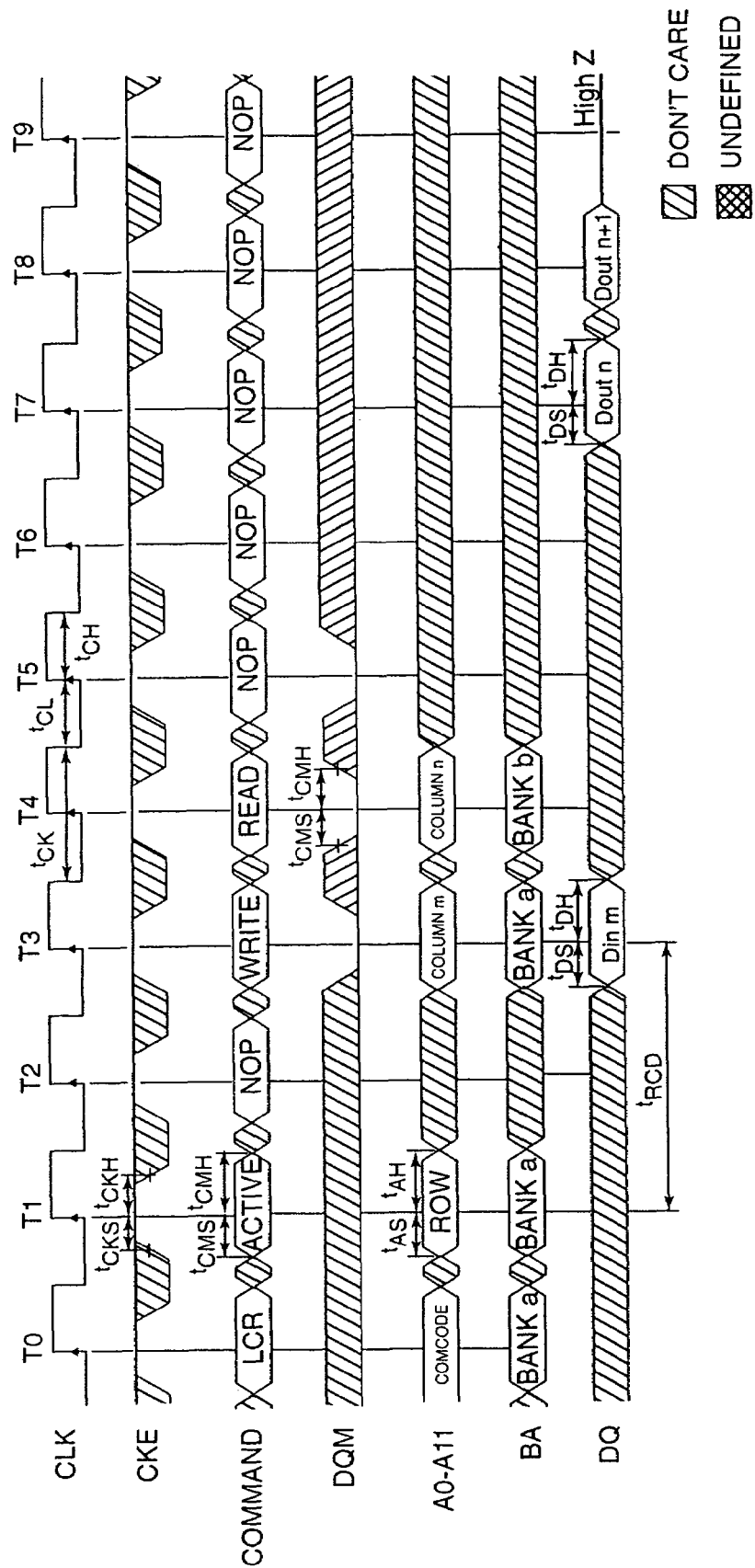
FIG. 17 illustrates the timing of a write operation followed by a read to a different bank.

Referring to FIG. 17, the timing of a write operation followed by a read to a different bank is illustrated. In this operation, a write is performed to bank a and a subsequent read is performed to bank b. The same row is accessed in each bank.

Figure 18:
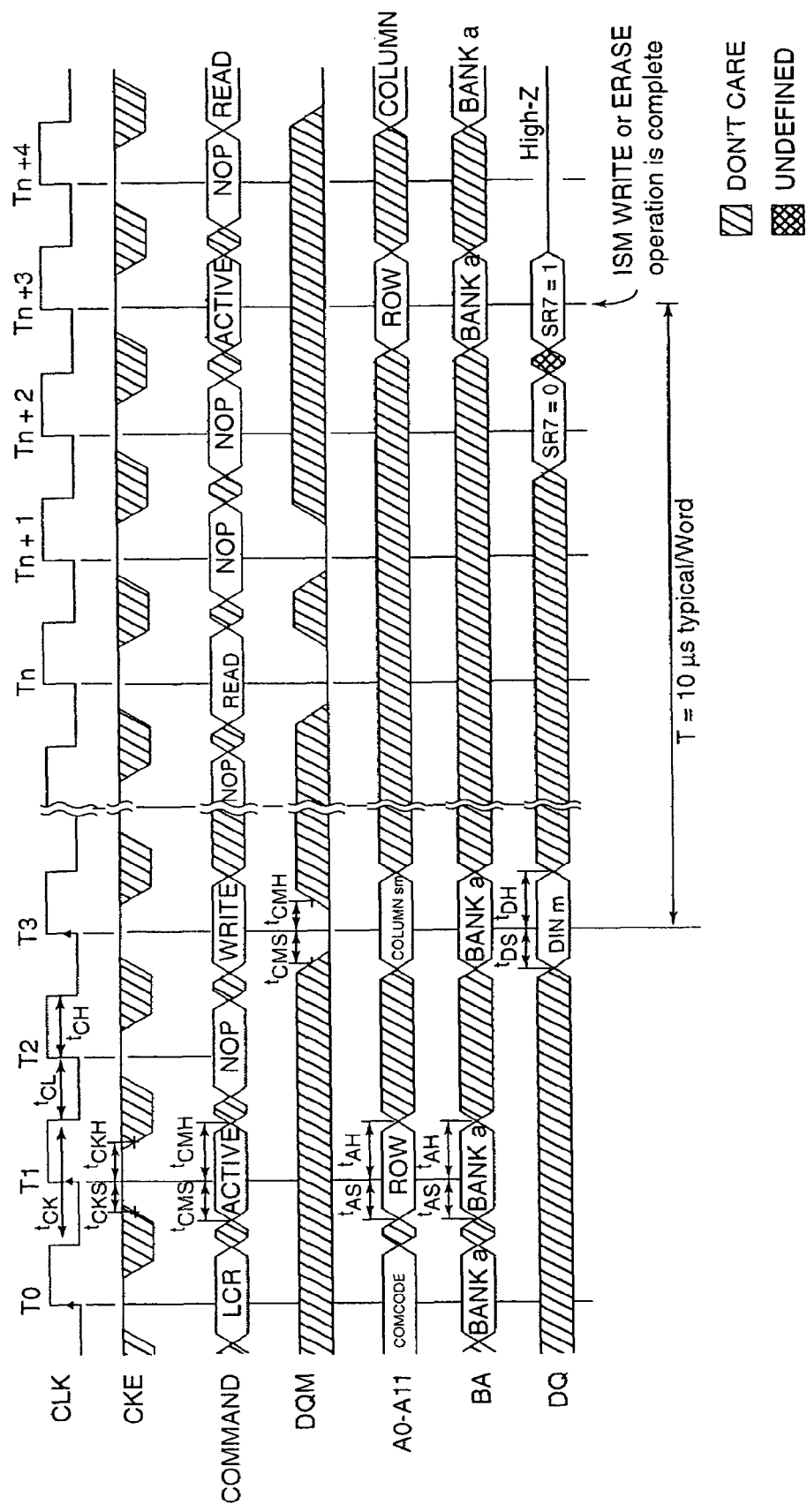
FIG. 18 illustrates the timing of a write operation followed by a read to the same bank.

Referring to FIG. 18, the timing of a write operation followed by a read to the same bank is illustrated. In this operation, a write is performed to bank a and a subsequent read is performed to bank a. A different row is accessed for the read operation, and the memory must wait for the prior write operation to be completed. This is different from the read of FIG. 30 where the read was not delayed due to the write operation.

Top/Bottom Symmetrical Protection

As stated above, Flash memory devices are often used to store important information, such as a program code or device settings. As a result, different data protection schemes have been implemented in different systems. One approach is to have a dedicated boot block area in one end of the memory space. Since a processor boots to either location 0000 or FFFF at power up (depending on the system), that segment of the code could have a hardware protection scheme to protect the data. Those protection schemes may require a high voltage be provided on some external connections to perform a Write or Erase operation on the boot block to ensure that the data space could be protected.

Some processors, such as those designed by Intel, start reading data from location 0000 at power up. Some other processors, such as the ones designed by Motorola, start reading data from the end of memory space (FFFF). Memory vendors, in order to reduce their designs, typically make one product and provide two fabrication options, known as metal options. The metal options define the part as a Top-Boot or Bottom-Boot. This solves the design problem, but provides problems during production.

The two primary problems with fabrication options are; projecting market needs, and accurate product identification. The first requires that market needs be anticipated prior to the fabrication option. This can be rather difficult and can result in either excess inventory or a shortage. The second problem is in labeling the fabricated parts to accurately reflect the fabrication option used. If parts are mislabeled, production may be scrapped and lead to economic waste.

The present invention has boot sections located at both the top 210 and bottom 220 of the memory addresses, see FIG. 19. Thus, a small space of the memory is reserved on either end and called boot sections. Writing to either one of these two segments would require extra hardware effort. That is, a security system, such as an electronic key or supervoltage, may be used to protect the content of the boot sectors. Thus, there is only one part type and number and either one of the processor designs can use the same part. In operation, a processor would access one of the boot sectors. The processor could then leap to the second boot sector if additional storage space is needed.

The present invention also provides a sector protect scheme that is software controlled. This protection system uses an X-bit register 149, FIG. 1A. Each bit of the register is used to protect a sector of the memory. For example, a 16-bit register could be used to protect 16 sectors of memory. Each bit indicates if a sector is Write/Erase protected. In one embodiment, a sector is protected when its register bit is a logic one. In another embodiment, a logic zero indicates that the corresponding sector is protected.

In operation, the memory control circuitry reads the sector protect register prior to Write or Erase operations. If the register indicates that the sector is protected, the operation is denied.

The Protect register is initially set to an unprotected state. Thus, any operation can be performed on all sectors, including the boot sectors. Once the register bits corresponding to the boot sectors have been set to a "protect" status, the memory activates a hardware protect system, as described above. The memory, therefore, allows for initial unprotected programming of the boot sectors, but then switches to a hardware protection based on the protect register content.

The Protect register 149 can comprise a non-volatile register, and a shadow volatile register that stores data transferred from the non-volatile register during power-up sequencing. The volatile register provides for fast access during operation, while allowing default settings to be non-volatily stored.

CONCLUSION

A synchronous flash memory has been described that includes an array of non-volatile memory cells. The memory device has a package configuration that is compatible with an SDRAM. The memory device can comprise an array of memory cells having N addressable sectors, and control circuitry to control erase or write operations on the array of memory cells. Protection circuitry can be coupled to the control circuitry to selectively prevent erase or write operations from being performed on both first and last sectors of the N addressable sectors. The protection circuitry can comprise a multi-bit register having a first bit corresponding to the first sector and a second bit corresponding to the last sector.

What is claimed is:

1. A non-volatile memory device comprising:
   a memory array comprising a plurality of non-adjacent boot areas;
   a data register, independent from the memory array and comprising a non-volatile portion and a volatile portion of the data register, wherein the data register stores a plurality of protect status bits, each bit corresponding to a protect status of each boot area; and
   a state machine adapted to perform an erase operation on the plurality of non-adjacent boot areas, wherein the state machine transfers a first protect status bit of the plurality of protect status bits from a non-volatile portion of the data register to a volatile portion of the data register, initiates the erase operation of a first boot area, reads the first protect status bit from the volatile data register, reads a security voltage, and authorizes the erase operation to the first boot area if the first protect status bit is in a first state or the security voltage is greater than a predetermined voltage.

2. The memory device of claim 1 wherein the state machine is further adapted to erase the plurality of non-adjacent boot areas as one boot area.

3. The memory device of claim 2 wherein the state machine is adapted to erase each of the plurality of non-adjacent boot areas in response to each boot area being programmed.

4. The memory device of claim 1 wherein the memory array is organized as a memory address space having a top address and a bottom address and the plurality of non-adjacent boot areas are comprised of one boot area at the top address and one boot area at the bottom address.

5. The memory device of claim 1 wherein the state machine transfers the first protect status bit during power-up of the memory device.

6. The memory device of claim 1 wherein the memory array is organized into sectors of memory and each sector of memory is assigned a different protect status bit of the plurality of protect status bits.

7. The memory device of claim 6 wherein the state machine is adapted to erase each sector of memory in response to its respective protect status bit.

8. A non-volatile memory device comprising:
   a memory array arranged into independently erasable memory sectors comprising first and second non-adjacent boot sectors;
   a data register, independent from the memory array and having a non-volatile register and a volatile register with locations corresponding to locations of the non-volatile register, for storing a plurality of protect status bits, each bit corresponding to a protect status of each boot area; and
   a state machine adapted to perform an erase operation on both of the first and second non-adjacent boot sectors in response to a received erase command, wherein the state machine transfers a first protect status bit of the plurality of protect status bits from the non-volatile register to its corresponding volatile register, initiates the erase operation of the first and second boot sectors, reads the first protect status bit from the volatile data register, reads a security voltage, and authorizes the erase operation of the first and second boot sectors if the first protect status bit is in a first state or the security voltage is greater than a predetermined voltage.

9. The memory device of claim 8 wherein the state machine is further adapted to read the first and second non-adjacent boot sectors as one boot sector.

10. The memory device of claim 8 and further including interconnect pins that are in a configuration that is substantially similar to SDRAM.

11. The memory device of claim 8 wherein the memory device is a synchronous flash memory device comprising a clock input.

12. The memory device of claim 10 wherein the interconnect pins include address pins that can load mode settings during a mode register loading operation.

13. The memory device of claim 12 wherein the mode settings include a burst length, a burst type, a column address strobe latency, and an operating mode.

14. The memory device of claim 12 and further comprising command execution logic, coupled to the state machine, having a mode register for storing the mode settings.

15. A memory system comprising:
   a processor for controlling the memory system; and
   a non-volatile memory device coupled to the processor, the memory device comprising:
      a memory array comprising a plurality of non-adjacent boot memory sectors;
      a data register, independent from the memory array and having a non-volatile register and a volatile register, for storing a plurality of protect status bits, each bit corresponding to a protect status of each boot memory sector; and
      a state machine adapted to perform an erase operation in response to an erase command from the processor, such that the erase operation erases a first of the plurality of boot memory sectors, wherein the state machine transfers a first protect status bit of the plurality of protect status bits from the non-volatile register to a corresponding bit of the volatile register, initiates the erase operation of the first boot memory sector, reads the first protect status bit from the volatile register, reads a security voltage, and authorizes the erase operation to the first boot memory sector if the first protect status bit is in a first state or the security voltage is greater than a predetermined voltage.

16. The system of claim 15 wherein the processor is coupled to the memory device with address lines such that the processor can select the first non-adjacent boot memory sector with an address of the first non-adjacent boot memory sector.

17. The system of claim 16 wherein the memory device further comprises a mode register for storing a mode received over the address lines.

18. The system of claim 17 wherein the mode register comprises a non-volatile mode register and a volatile mode register.

19. The system of claim 18 wherein the state machine is further adapted to transfer a default mode, stored in the non-volatile mode register, to the volatile mode register.

20. The system of claim 15 and further including a plurality of interconnect pins to which the security voltage is coupled.

* * * * *

UNITED STATES PATENT AND TRADEMARK OFFICE
CERTIFICATE OF CORRECTION

PATENT NO. : 7,409,493 B2  Page 1 of 1
APPLICATION NO. : 11/541820
DATED : August 5, 2008
INVENTOR(S) : Roohparvar et al.

It is certified that error appears in the above-identified patent and that said Letters Patent is hereby corrected as shown below:

On the Title page, in field (75), in "Inventors", in column 1, line 1, delete "Miltitas" and insert -- Milpitas --, therefor.

Signed and Sealed this

Twenty-first Day of October, 2008

JON W. DUDAS
*Director of the United States Patent and Trademark Office*